United States Patent
Yatagawa et al.

(10) Patent No.: US 11,631,542 B2
(45) Date of Patent: Apr. 18, 2023

(54) ELECTRONIC COMPONENT, CIRCUIT BOARD ARRANGEMENT AND METHOD OF MANUFACTURING ELECTRONIC COMPONENT

(71) Applicant: TAIYO YUDEN CO., LTD., Tokyo (JP)

(72) Inventors: Kiyoshiro Yatagawa, Tokyo (JP); Satoshi Kobayashi, Tokyo (JP); Ryosuke Hoshino, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 17/331,559

(22) Filed: May 26, 2021

(65) Prior Publication Data
US 2021/0375550 A1    Dec. 2, 2021

(30) Foreign Application Priority Data

Jun. 1, 2020    (JP) .............................. JP2020-095333

(51) Int. Cl.
| | |
|---|---|
| *H01G 4/30* | (2006.01) |
| *H05K 1/18* | (2006.01) |
| *H01G 4/12* | (2006.01) |
| *H01G 4/248* | (2006.01) |
| *H01G 4/012* | (2006.01) |

(52) U.S. Cl.
CPC .............. *H01G 4/30* (2013.01); *H01G 4/012* (2013.01); *H01G 4/1227* (2013.01); *H01G 4/248* (2013.01); *H05K 1/181* (2013.01); *H05K 2201/10015* (2013.01)

(58) Field of Classification Search
CPC ....................................................... H01G 4/30
USPC ........................................................ 174/260
See application file for complete search history.

(56) References Cited

U.S. PATENT DOCUMENTS

| | | | | |
|---|---|---|---|---|
| 10,361,035 | B1* | 7/2019 | Song ......................... | H01G 4/30 |
| 2011/0300307 | A1* | 12/2011 | Nakai ..................... | B23K 26/40 |
| | | | | 427/555 |
| 2014/0041913 | A1 | 2/2014 | Yanagida et al. | |
| 2015/0364253 | A1* | 12/2015 | Arnold ................... | G10K 11/16 |
| | | | | 174/260 |

(Continued)

FOREIGN PATENT DOCUMENTS

JP    2014-053599 A    3/2014

OTHER PUBLICATIONS

U.S. Appl. No. 17/331,552, filed May 26, 2021.

*Primary Examiner* — Stanley Tso
(74) *Attorney, Agent, or Firm* — Chen Yoshimura LLP

(57) ABSTRACT

An electronic component includes an element body having a dielectric and an inner electrode. The electronic component also includes at least one external electrode. Each external electrode includes a base layer, a plating layer and a covering layer. The base layer is formed on a plurality of surfaces of the element body to have a plurality of faces facing different directions. The base layer is connected to the inner electrode, and contains a metal. The plating layer is formed on a mounting face of the base layer and on a side face of the base layer to which the inner electrode is connected. The covering layer is formed on at least a portion of a face of the base layer, which is opposite to the mounting face of the base layer. A surface of the covering layer is less wettable than a surface of the plating layer by solder.

19 Claims, 14 Drawing Sheets

(56) References Cited

U.S. PATENT DOCUMENTS

| | | | | |
|---|---|---|---|---|
| 2019/0164693 A1* | 5/2019 | Ono | ............... | H01G 4/30 |
| 2021/0045227 A1* | 2/2021 | Mayr | ............... | H05K 3/06 |
| 2021/0125783 A1* | 4/2021 | Onodera | ............... | H01G 2/06 |
| 2021/0265114 A1* | 8/2021 | Park | ............... | H01G 4/248 |

* cited by examiner

ELECTRONIC COMPONENT, CIRCUIT BOARD ARRANGEMENT AND METHOD OF MANUFACTURING ELECTRONIC COMPONENT

FIELD OF THE INVENTION

The present invention relates to an electronic component, a circuit board arrangement and a method of manufacturing the electronic component.

DESCRIPTION OF THE RELATED ART

In order to reduce a mounting area of an electronic component with a demand for downsizing of an electronic device, an external electrode is often formed on an element body in which an internal electrode is provided. The external electrode is connected to a circuit board by soldering such that an electronic component is mounted on the circuit board.

The external electrode may be formed not only on the mounting surface of the element body, but also on the side surface and the upper surface of the element body. In this configuration, the wet solder may move up to the upper surface of the external electrode along the side surface of the external electrode and increase the height of the circuit board.

To prevent the wet solder from moving upward (wetting up of the solder) along the side surface of the terminal electrode and reaching the upper surface of the terminal electrode, JP-2014-53599A discloses a configuration in which the side surface portions of the first and second terminal electrodes, which are formed on the side surface of the electronic component, are covered with an oxide film.

SUMMARY OF THE INVENTION

However, if the side surface portion of the terminal electrode is covered with the oxide film, and an excess amount of solder is supplied, an amount of solder that spreads out of the mounting surface into unintended directions may increase, and this may hinder high-density mounting of electronic components. Moreover, in a typical configuration that allows the solder to wet the entire surface of an external electrode, the solder may wet up along the side surface of the external electrode and reach the upper surface of the external electrode. As a result, a circuit board on which components are mounted may end up having a height greater than originally designed.

Accordingly, an object of the present invention is to provide an electronic component that can prevent solder from wetting up to a surface opposite to a mounting surface while regulating an amount of solder that spreads out of the mounting surface. Another object of the present invention is to provide a method of manufacturing such electronic component. Still another object of the present invention is to provide a circuit board arrangement that can prevent solder from wetting up to a surface opposite to the mounting surface while regulating an amount of solder that spreads out of the mounting surface.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an electronic component that includes an element body and at least one external electrode. The element body includes a dielectric body and an inner electrode. Each external electrode includes a base layer, a plating layer, and a covering layer. The base layer is formed over a plurality of surfaces of the element body, is connected to the inner electrode, and contains a metal. The plating layer is formed on a mounting surface of the base layer and on a side surface of the base layer to which the inner electrode is connected. The covering layer is formed on at least a portion of a surface of the base layer, which is opposite to the mounting surface. The covering layer is less wettable than the plating layer by solder.

The base layer may be formed on the side surface of the element body and extend onto front and rear surfaces and upper and lower surfaces of the element body from the side surface. The mounting surface may be located below the lower surface of the element body. The covering layer may be provided on an upper surface of the base layer. The plating layer may be formed on front and rear surfaces of the base layer.

The covering layer may include an oxide film of the metal of the base layer.

The base layer may include a first co-material that coexists with the metal. The covering layer may include a second co-material.

The first co-material included in the base layer and the second co-material included in the covering layer may have an identical composition.

The first co-material may be a ceramic oxide that includes the dielectric. The second co-material may also be a ceramic oxide that includes the dielectric.

The covering layer may be a resist film that includes resin.

The base layer may include a glass component.

The covering layer may include a glass phase that has a composition identical to the composition of the glass component included in the base layer.

The metal in the base layer may be a metal or an alloy that contains at least one selected from Cu, Fe, Zn, Al, and Ni.

The plating layer may include an Ni-plating layer and an Sn-plating layer formed on the Ni-plating layer.

The covering layer may be disposed in a belt-like pattern on a surface of the base layer which is opposite to the mounting surface of the base layer, such that the belt-like pattern is continuous along a periphery of the base layer that is in contact with the side surface, the front surface and the rear surface of the base layer.

The base layer may have a chamfered surface on a ridge portion of the base layer. At least a portion of an end of the covering layer may extend along the chamfered surface of the base layer.

An angle formed by the surface opposite to the mounting surface of the external electrode and a tangent of the chamfered surface at a position where the end of the covering layer is in contact with a side surface of the base layer may be greater than 45 degrees.

The inner electrode may include at least one first inner electrode layer and at least one second inner electrode layer. The element body may include a laminate in which the first inner electrode layer(s) and the second inner electrode layer(s) are laminated in an alternating manner with the dielectric (layers) interposed therebetween. The above-mentioned at least one external electrode may include a first external electrode and a second external electrode that are provided on opposing side surfaces of the laminate. The first inner electrode layer(s) may be connected to the first external electrode. The second inner electrode layer(s) may be connected to the second external electrode.

According to a second aspect of the present invention, there is provided a circuit board arrangement that includes a circuit board and any of the above-described electronic components mounted on the circuit board. The electronic component is connected to the circuit board via a solder layer stuck to a mounting surface of the plating layer, with the solder layer wetting up to the side surface of the external electrode.

According to a third aspect of the present invention, there is provided a method of manufacturing an electronic component. The method includes forming an element body that includes a dielectric and an inner electrode, applying an electrode material containing a metal to a side surface of the element body and surrounding surfaces of the side surface of the element body, sintering the electrode material to form a base layer containing the metal onto the side surface of the element body and the surrounding surfaces of the side surface of the element body, forming a covering layer that covers a surface of the base layer, removing the covering layer from a mounting surface and a side surface of the base layer while leaving the covering layer on a surface opposite to the mounting surface of the base layer, and forming a plating layer on the mounting surface and the side surface of the base layer. The covering layer is less wettable than the plating layer by solder.

The step of forming the covering layer that covers the surface of the base layer may include oxidizing the metal to form an oxide film of the metal on the surface of the base layer.

The electrode material may include a glass component.

The step of forming the covering layer that covers the surface of the base layer may include causing a glass phase composed of the glass component to surface onto the surface of the base layer when sintering the electrode material.

The step of removing the covering layer from the mounting surface and the side surface of the base layer may include blasting the covering layer that exists on the mounting surface of the base layer.

According to one aspect of the present invention, it is possible to prevent solder from wetting up to a surface opposite a mounting surface while regulating an amount of solder that spreads out of the mounting surface.

It is to be understood that both the foregoing general description and the following detailed description are exemplary and explanatory, and are intended to provide further explanation of the invention as claimed.

DESCRIPTION OF THE EMBODIMENTS

Figure 1:
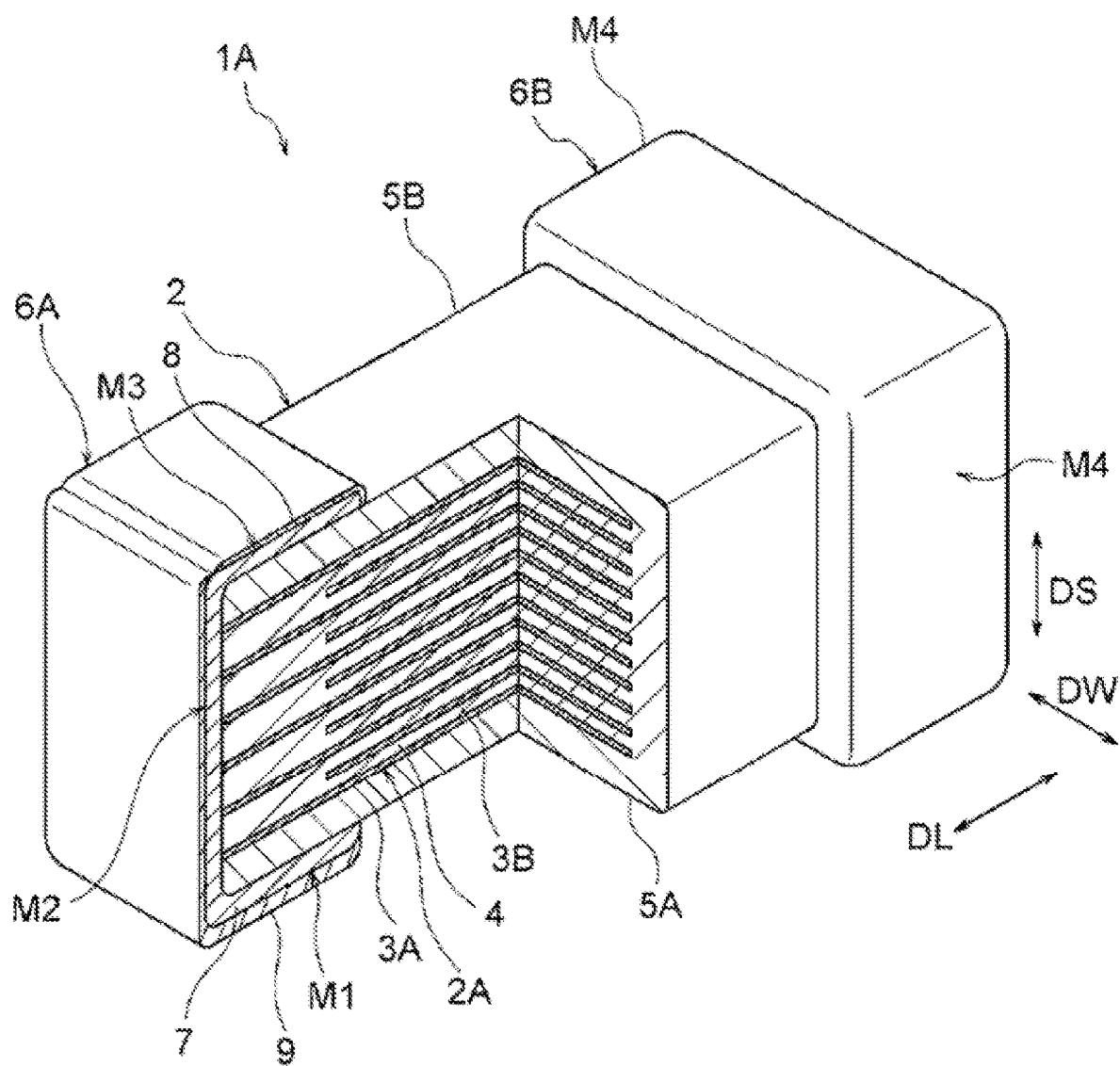
FIG. 1 is a perspective view illustrating a configuration of a multilayer ceramic capacitor according to a first embodiment of the present invention.

Hereinafter, some embodiments of the present invention will be described in detail with reference to the accompanying drawings. It should be noted that the following embodiments do not limit the present invention, and not all the combinations of the features described in the embodiments are necessarily essential in the configurations of the present invention. The configurations of the embodiments can be modified or changed, as appropriate, in accordance with the specifications of and various conditions (conditions under which and/or environments under which a device is used) for the device to which the present invention is applied. The technical scope of the present invention is defined by the claims and is not limited by the following individual embodiments. Moreover, to facilitate the understanding of each feature and structure, the features and structures shown in the drawings referred to in the following description may differ from the actual features and structures in terms of their scale, shape, and so on.

First Embodiment

Figure 2:
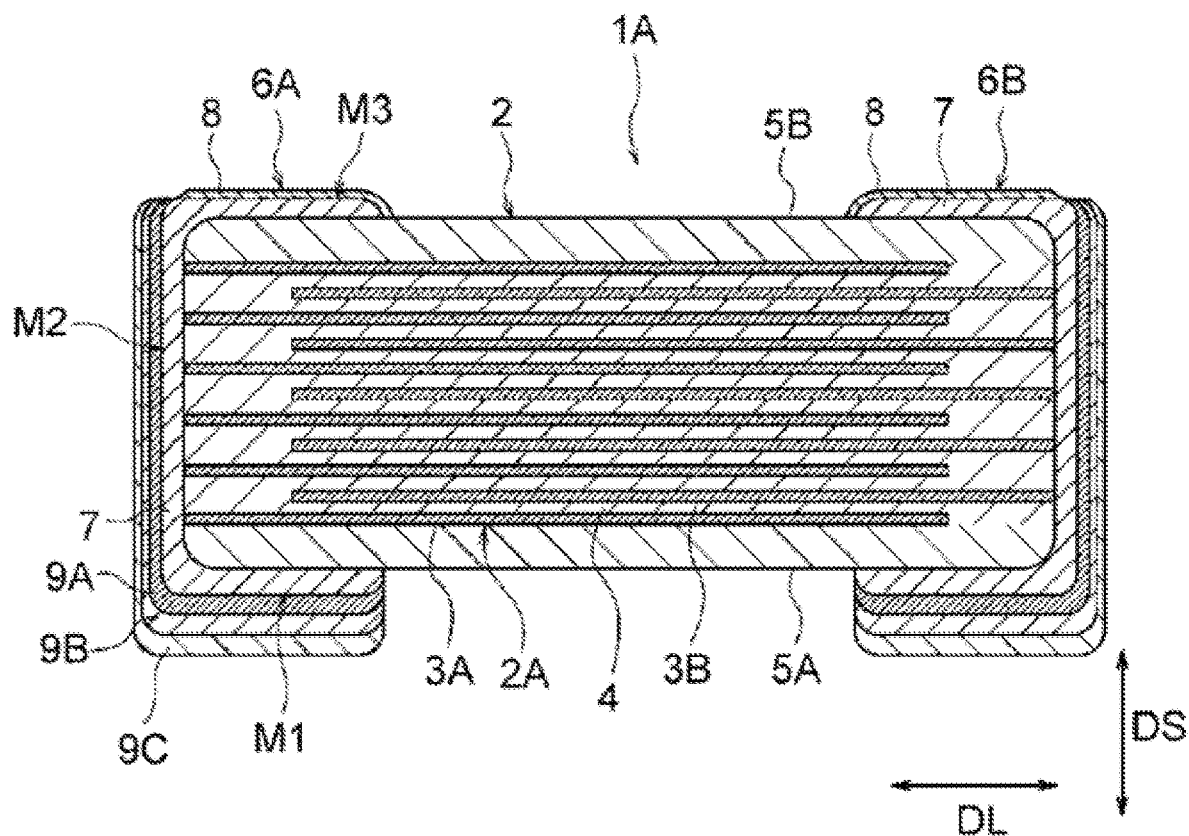
FIG. 2 is a cross-sectional view of the multilayer ceramic capacitor illustrated in FIG. 1, taken along a lengthwise direction.

FIG. 1 is a perspective view illustrating a configuration of a multilayer ceramic capacitor 1A according to a first embodiment of the present invention. FIG. 2 is a cross-sectional view of the multilayer ceramic capacitor 1A illustrated in FIG. 1, taken along a lengthwise direction.

Referring to FIG. 1 and FIG. 2, a multilayer ceramic capacitor 1A includes an element body (element assembly) 2 and two external electrodes (outer electrodes) 6A and 6B. The element body 2 includes a laminate 2A, a lower cover layer 5A, and an upper cover layer 5B. The laminate 2A includes inner electrode layers 3A and 3B and dielectric layers 4.

The lower cover layer 5A is provided as a layer posited under the laminate 2A, and the upper cover layer 5B is provided as a layer on top of the laminate 2A. The inner electrode layers 3A and 3B are stacked in an alternating manner with each dielectric layer 4 interposed therebetween. The element body 2 may have a substantially rectangular parallelepiped shape. Similarly, the laminate 2A may have a substantially rectangular parallelepiped shape. The element body 2 may be chamfered along its ridgeline(s). In the following description, the direction in which two side surfaces of the element body 2 oppose each other may be referred to as a lengthwise direction DL, the direction in which front and rear surfaces of the element body 2 oppose each other may be referred to as a widthwise direction DW, and the direction in which upper and lower surfaces of the element body 2 oppose each other may be referred to as a stacking direction DS.

The external electrodes 6A and 6B are disposed on the opposing side surfaces of the element body 2 such that the external electrode 6A is spaced (separated) from the external electrode 6B. Each of the external electrodes 6A and 6B is present on the associated side surface of the element body 2 and extends onto the front surface, the rear surface, the upper surface and the lower surface of the element body 2 from the side surface of the element body 2. The external electrode 6A has the same configuration as the external electrode 6B.

The inner electrode layers 3A and 3B are disposed at different positions in the lengthwise direction DL within the laminate 2A. Specifically, the inner electrode layers 3A can be disposed closer to the left side surface of the element body 2 than the inner electrode layers 3B, and the inner electrode layers 3B can be disposed closer to the opposite side surface (right side surface) of the element body 2 than the inner electrode layers 3A. The ends of the inner electrode layers 3A are drawn to ends of the dielectric layers 4 at one side surface in the longitudinal direction DL of the element body 2 and connected to the outer electrode 6A. The ends of the inner electrode layer 3B are drawn to the opposite ends of the dielectric layers 4 at the other side surface in the longitudinal direction DL of the element body 2 and connected to the outer electrode 6B.

On the other hand, in the direction (widthwise direction DW) orthogonal to the direction (lengthwise direction DL) in which the side surfaces of the element body 2 oppose each other, ends of the inner electrode layers 3A and 3B are covered with the dielectric layers 4. In the widthwise direction DW, the positions of the ends of the inner electrode layers 3A may be aligned with the positions of the ends of the inner electrode layers 3B.

In one example, the outer size of the multilayer ceramic capacitor 1A may satisfy the condition of the length being greater than the width, and the width being greater than the height or the condition of the length being greater than the width, and the width being equal to the height. For example, the multilayer ceramic capacitor 1A can have a height of 1.0 mm, a width of 0.5 mm, and a height of 0.15 mm or have a length of 1.0 mm, a width of 0.5 mm, and a height of 0.5 mm. The inner electrode layers 3A and 3B and the dielectric layer 4 can each have a thickness in the stacking direction DS in the range from 0.05 μm to 5 μm. For example, the thickness of the inner electrode layer 3A is 0.3 μm, the thickness of the inner electrode layer 3B is 0.3 μm and the thickness of the dielectric layer 4 is 0.3 μm.

A material for the inner electrode layers 3A and 3B can be selected, for example, from metals, such as copper (Cu), nickel (Ni), titanium (Ti), silver (Ag), gold (Au), platinum (Pt), palladium (Pd), tantalum (Ta), and tungsten (W), or may be an alloy including any of these metals.

A material for the dielectric layers 4 can include, as a main component, a ceramic material having the perovskite structure, for example. It suffices that the main component be included 50 at % or more. The ceramic material for the dielectric layers 4 can be selected, for example, from barium titanate, strontium titanate, calcium titanate, magnesium titanate, barium strontium titanate, barium calcium titanate, calcium zirconate, barium zirconate, calcium titanate zirconate, titanium oxide, and the like.

The main component of the material for the lower cover layer 5A and the upper cover layer 5B can be a ceramic material, for example. If the main component of the lower cover layer 5A and the upper cover layer 5B is the ceramic material, the main component of the ceramic material for the lower cover layer 5A and the upper cover layer 5B may be identical to the main component of the ceramic material for the dielectric layers 4.

Each of the external electrodes 6A and 6B includes a base layer (underlayer) 7 formed on the element body 2 and a plating layer 9 formed on the base layer 7. Each of the external electrodes 6A and 6B has a mounting surface (bottom surface) M1, a side surface M2, and an upper (top) surface M3. The mounting surface M1 is a surface that will face a circuit board on which the multilayer ceramic capacitor 1A is to be mounted. The mounting surface M1 is located under the lower (bottom) surface of the element body 2. The upper surface M3 is a face opposite to the mounting surface M1.

The surface (upper surface M3) of each of the external electrodes 6A and 6B other than the mounting surface M1 and the side surface M2 is covered with a covering layer 8.

The plating layer 9 is formed on the mounting surface M1 and the side surface M2 of the base layer 7 in each of the external electrodes 6A and 6B. It should be noted that the plating layer 9 may be provided not only on the mounting surface M1 and the side surface M2 of the base layer 7 of the element body 2 but also on the front surface M4 and the rear surface M4 of the base layer 7 of the element body 2. The thickness of each of the external electrodes 6A and 6B is, for example, in the range from 10 µm to 40 µm at the mounting surface M1, the side surface M2, and the front surface M4 and the rear surface M4.

A conductive material of the base layers 7 may include, as a main component, a metal or an alloy that contains at least one selected from Cu, iron (Fe), zinc (Zn), aluminum (Al), Ni, Pt, Pd, Ag, Au, and tin (Sn), for example. Each of the base layers 7 may include particles of co-material. When the particles of the co-material are mixedly present in each of the base layers 7 in the form of islands, the co-material can reduce the difference between the coefficient of thermal expansion of the element body 2 and the coefficient of thermal expansion of the base layer 7 and can alleviate a stress exerted on the base layer 7. The co-material is, for example, a ceramic component which is the main component of the dielectric layers 4. Each of the base layers 7 may include a glass component. When the glass component is mixedly present in each of the base layers 7, the glass component can increase, for example, the densification of the base layer 7. This glass component is, for example, an oxide of barium (Ba), strontium (Sr), calcium (Ca), Zn, Al, silicon (Si), boron (B), or the like.

The covering layer 8 is formed on the upper surface M3 of the base layer 7 of each of the external electrodes 6A and 6B. The covering layer 8 includes an oxide film resulting from oxidation of a metal in the base layer 7 and a surface layer made from the co-material of the base layer 7 which is exposed to the surface of the base layer 7. The oxide film of the base layer 7 and the co-material of the base layer 7 coexist in the surface of each of the covering layers 8. A material for the covering layers 8 includes an oxide film of a metal used as the conductive material of the base layers 7. The material for the covering layers 8 may further include the co-material of the base layers 7. The oxide film has a thickness of, for example, from 0.05 µm to 3 µm. A component of the oxide film is, for example, nickel oxide or copper oxide. The co-material in the base layers 7 is, for example, a ceramic oxide which is a main component of the dielectric layer 4, and a main component of the ceramic oxide is barium titanate. The oxide film of the metal and the co-material coexist in the surface of each of the covering layers 8, and therefore the wet solder does not move onto the surface of the covering layer 8 easily.

Each of the base layers 7 and the covering layers 8 may include a metal component included in the element body 2. This metal component is, for example, Mg. This metal component may additionally contain a small amount of Ni, Cr, Sr, Al, Na, or Fe. In this configuration, each of the base layers 7 and the covering layers 8 may include a compound that contains, for example, Mg, Ni, or O, as a compound of the metal used as the conductive material of the base layer 7, the metal included in the element body 2, and oxygen.

A material for the plating layers 9 includes, as a main component, a metal, such as Cu, Ni, Al, Zn, or Sn, or an alloy of two or more of these metals, for example. Each of the plating layers 9 may be a plating layer made from a single metal component or may have a multi-layer structure that includes a plurality of different metal components. As illustrated in FIG. 2, for example, each of the plating layers 9 may have a three-layer structure consisting of a Cu-plating layer 9A formed on the base layer 7, an Ni-plating layer 9B formed on the Cu-plating layer 9A, and an Sn-plating layer 9C formed on the Ni-plating layer 9B. The Cu-plating layer 9A can improve the adhesiveness of the plating layer 9 to the base layer 7. The Ni-plating layer 9B can enhance the thermal resistance of the external electrode 6A, 6B during soldering. The Sn-plating layer 9C can improve the wettability of solder on the plating layer 9. The plating layer 9 is formed on a part of each of the base layers 7 and becomes electrically continuous with the inner electrode layers. Moreover, each of the plating layers 9 can become electrically continuous with terminals on the circuit board via solder. When the metal component of the base layers 7 is Cu, the Cu-plating layers 9A may not be formed. If the Cu-plating layers 9A are not formed, each of the plating layers 9 may have a two-layer structure consisting of the Ni-plating layer 9B and the Sn-plating layer 9C formed on the Ni-plating layer 9B.

According to the above-described first embodiment, the upper surface M3 of each of the external electrodes 6A and 6B is covered with the covering layer 8, and the plating layer 9 is formed on the mounting surface M1 and the side surface M2 of each of the external electrodes 6A and 6B. This configuration allows solder to wet up to the side surface M2 of each of the external electrodes 6A and 6B while preventing the solder from wetting up to the upper surface M3 of each of the external electrodes 6A and 6B. Therefore, even if an excess amount of solder is supplied, the above-described configuration can avoid any increase in the height of the multilayer ceramic capacitor 1A mounted on a circuit board while preventing the solder from spreading out of the mounting region of the multilayer ceramic capacitor 1A (or reducing an amount of solder spreading out of the mounting region of the capacitor 1A). Accordingly, electronic components can be mounted on the circuit board at a high density while preventing the circuit board on which the electronic components are mounted from having a height greater than a designed value. Furthermore, the covering layers on the upper surface of the element body 2 can alleviate, if any, the mechanical stress exerted from the above and can avoid any crack, fracture, or break in the element body 2.

Second Embodiment

Figure 3:
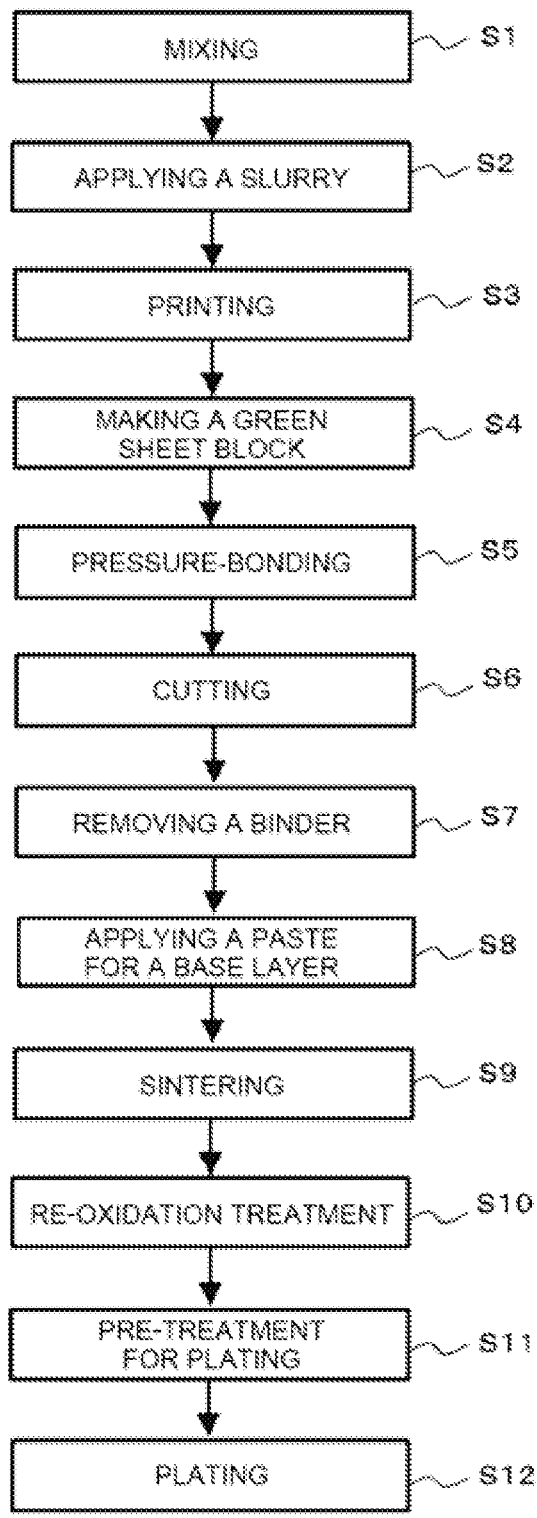
FIG. 3 is a flowchart illustrating a method of manufacturing a multilayer ceramic capacitor according to a second embodiment of the present invention.

FIG. 3 is a flowchart illustrating a method of manufacturing a multilayer ceramic capacitor according to a second embodiment of the present invention. FIG. 4A to FIG. 4H, FIG. 4J and FIG. 4K are a series of cross-sectional views illustrating the method of manufacturing the multilayer ceramic capacitor according to the second embodiment. It should be noted that in FIG. 4C to FIG. 4H, FIG. 4J and FIG. 4K, only two inner electrode layers 3A and only two inner electrode layers 3B are illustrated and stacked in an alternating manner via the dielectric layers 4 for the sake of illustration.

At Step S1 of FIG. 3, an organic binder and an organic solvent, serving as a dispersant and a forming aid, are added to dielectric material powder, pulverized, and mixed to produce a muddy slurry. The dielectric material powder includes, for example, ceramic powder. The dielectric material powder may include an additive. The additive is, for example, an oxide of Mg, Mn, V, Cr, Y, Sm, Eu, Gd, Tb, Dy, Ho, Er, Tm, Yb, Co, Ni, Li, B, Na, K, or Si or glass. The organic binder is, for example, polyvinyl butyral resin or polyvinyl acetal resin. The organic solvent is, for example, ethanol or toluene.

Figure 4A:
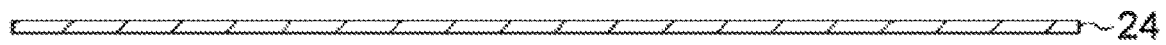
FIG. 4A is a cross-sectional view useful to describe the method of manufacturing the multilayer ceramic capacitor according to the second embodiment.

Next, as indicated in Step S2 of FIG. 3 and shown in FIG. 4A, the slurry that includes the ceramic powder is applied in a sheet-like form onto a carrier film and dried to fabricate a green sheet 24. The carrier film is, for example, a polyethylene terephthalate (PET) film. The slurry can be applied through doctor blading, die coating, gravure coating, or the like. Step S2 is repeated to prepare a plurality of green sheets 24.

Figure 4B:
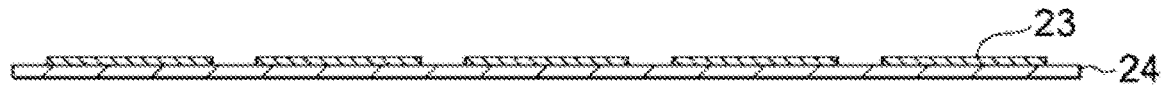
FIG. 4B is another cross-sectional view useful to describe the method of manufacturing the multilayer ceramic capacitor according to the second embodiment.

Next, as indicated in Step S3 of FIG. 3 and shown in FIG. 4B, a conductive paste, which will become the inner electrode, is applied in a predetermined pattern onto each of those green sheets 24, which will form the inner electrode layers 3A and 3B shown in FIG. 1, among the green sheets prepared in Step S1 to form a plurality of inner electrode patterns 23 on that green sheet 24. In Step S3, it is possible to form a plurality of inner electrode patterns 23 on the single green sheet 24 such that the inner electrode patterns 23 are separated from each other in the longitudinal direction of the green sheet 24. The conductive paste for the inner electrodes includes powder of the metal used as the material for the inner electrode layers 3A and 3B. For example, if the metal used as the material for the inner electrode layers 3A and 3B is Ni, the conductive paste for the inner electrodes includes Ni powder. The conductive paste for the inner electrodes includes a binder, a solvent, and an auxiliary agent. The conductive paste for the inner electrodes may include, as a co-material, a ceramic material which is the main component of the dielectric layer 4. The conductive paste for inner electrodes can be applied through screen printing, inkjet printing, gravure printing, or the like.

Figure 4C:
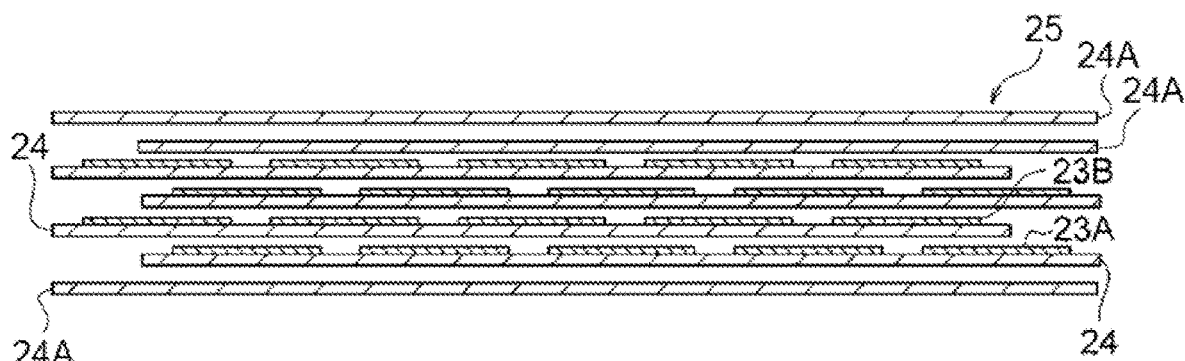
FIG. 4C is still another cross-sectional view useful to describe the method of manufacturing the multilayer ceramic capacitor according to the second embodiment.

Next, as indicated in Step S4 of FIG. 3 and shown in FIG. 4C, a multilayer block 25 (block of green sheets 24) is fabricated by stacking, in a predetermined order, the green sheets 24 on which the inner electrode patterns 23 are formed and the green sheets 24A on which no inner electrode pattern is formed. The green sheets 24A on which the inner electrode patterns 23 are not formed are used as outer layers. In Step S4, the green sheets 24 having the inner electrode patterns 23 thereon are divided into two groups, i.e., the green sheets 24 having the inner electrode patterns 23A thereon and the green sheets 24 having the inner electrode patterns 23B thereon. Then, the green sheets 24 having the inner electrode patterns 23A thereon and the green sheets 24 having the inner electrode patterns 23B are stacked alternately in the laminating direction such that the inner electrode patterns 23A on the green sheet 24 and the inner electrode patterns 23B on the next or adjacent green sheet 24 are alternately shifted in the longitudinal direction of the green sheet 24. Further, three types of portions are defined in the green sheet block 25. Specifically, a portion where only the inner electrode patterns 23A are stacked in the stacking direction, a portion where the inner electrode patterns 23A and 23B are stacked in an alternating manner in the stacking direction, and a portion where only the inner electrode patterns 23B are stacked in the stacking direction are defined in the green sheet block 25.

Figure 4D:
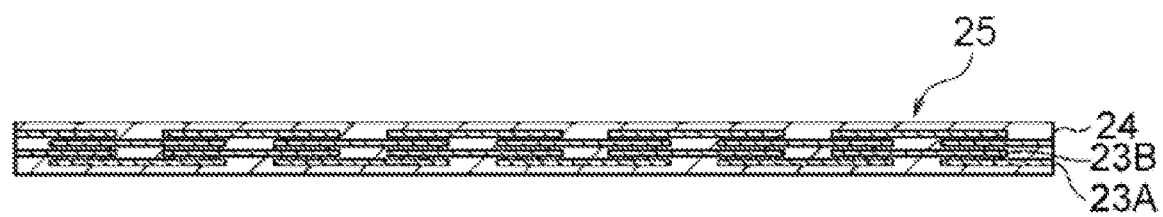
FIG. 4D is yet another cross-sectional view useful to describe the method of manufacturing the multilayer ceramic capacitor according to the second embodiment.

Next, as indicated in Step S5 of FIG. 3 and shown in FIG. 4D, the laminate block 25 obtained in the forming process at Step S4 of FIG. 3 is pressed such that the green sheets 24 are pressure-bonded. Pressing the laminate block 25 may be carried out by, for example, sandwiching the laminate block 25 between resin films, and hydrostatically pressing the laminate block 25.

Figure 4E:
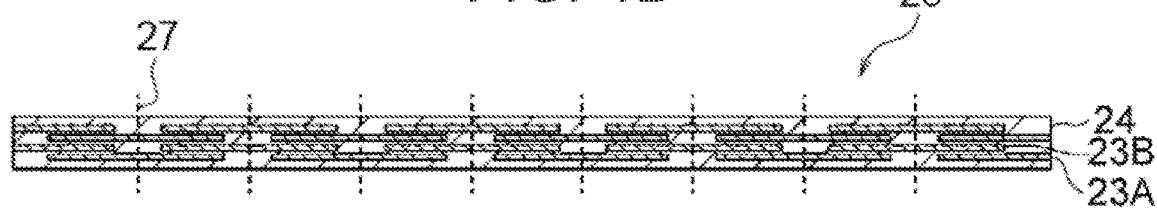
FIG. 4E is another cross-sectional view useful to describe the method of manufacturing the multilayer ceramic capacitor according to the second embodiment.

Next, as indicated in Step S6 of FIG. 3 and shown in FIG. 4E, the pressed laminate block 25 is cut such that the block 25 is separated to a plurality of element bodies, each of which has a rectangular parallelepiped shape. Each element body has six surfaces. The cutting of the laminate block 25 is carried out at portions where only the inner electrode patterns 23A are present in the stacking direction and the portions where only the inner electrode patterns 23B are present in the stacking direction, as indicated by a plurality of vertical broken lines 27. The laminate block 25 may be cut, for example, through blade dicing or the like. The resulting element bodies 2 are shown in FIG. 4F.

Figure 4F:
FIG. 4F is another cross-sectional view useful to describe the method of manufacturing the multilayer ceramic capacitor according to the second embodiment.

As illustrated in FIG. 4F, the inner electrode layers 3A and 3B are alternately stacked, with the dielectric layers 4 being interposed therebetween, in each of the individual element bodies 2. The inner electrode layers 3A are exposed on one side face of the element body 2, and the inner electrode layers 3B are exposed on the other side face of the element body 2.

Next, as indicated in Step S7 of FIG. 3, the binder included in each of the element bodies 2 obtained in Step S6 of FIG. 3 is removed. To remove the binder, the element body is heated, for example, in $N_2$ atmosphere at about 350 degrees C.

Next, as indicated in Step S8 of FIG. 3, a conductive paste for the base layer (underlayer) 7 is applied to both side surfaces of each element body 2 from which the binder is removed in Step S7 of FIG. 5 and to those edges of the remaining four surfaces of the element body 2 which are in contact with the side surfaces. Then, the conductive paste is dried. The conductive paste for the base layer includes powder or a filler of the metal used as the conductive material of the base layer 7. For example, if the metal used as the conductive material of the base layer 7 is Ni, the conductive paste for the base layer includes Ni powder or a Ni filler. The conductive paste for the base layer includes, as a co-material, a ceramic component which is the main component of the dielectric layer 4, for example. For example, ceramic oxide particles (D-50 particle size of from 0.8 µm to 4 µm) having barium titanate as a main component are mixed as a co-material into the conductive paste for the base layer. The conductive paste for the base layer further includes a binder and a solvent.

Figure 4G:
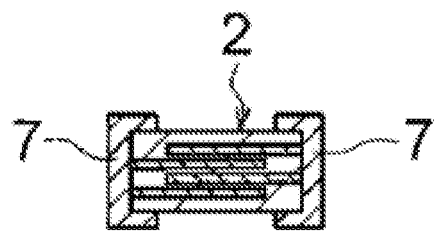
FIG. 4G is another cross-sectional view useful to describe the method of manufacturing the multilayer ceramic capacitor according to the second embodiment.

Next, as indicated in Step S9 of FIG. 3 and shown in FIG. 4G, the element bodies 2 to which the conductive paste for the base layers has been applied at Step S8 of FIG. 3 undergo the sintering process such that the inner electrode layers 3A and 3B are integrated with the dielectric layers 4 in each element body 2 and the base layers 7 are formed and integrated with the element body 2. The element bodies 2 are sintered, for example, in a firing furnace in a temperature range from 1000 degrees C. to 1350 degrees C. for 10 minutes to 2 hours. If a base metal, such as Ni or Cu, is used in the inner electrode layers 3A and 3B, the element bodies 2 may be sintered with the inside of the firing furnace being kept to a reducing atmosphere in order to prevent oxidation of the inner electrode layers 3A and 3B.

Figure 4H:
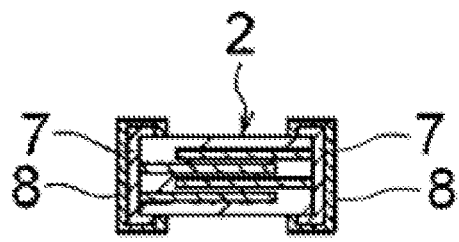
FIG. 4H is another cross-sectional view useful to describe the method of manufacturing the multilayer ceramic capacitor according to the second embodiment.

Next, as indicated in Step S10 of FIG. 3 and shown in FIG. 4H, the metal exposed to the surface of each base layer 7 is oxidized such that the covering layer 8 that includes the oxide film of that metal is formed on the surface of each base layer 7. The covering layers 8 may include the co-material of the base layer 7. In the oxidation of the metal exposed to the surface of each base layer 7, the reoxidation process may be performed in the temperature range, for example, from 600 degrees C. to 1000 degrees C. in the $N_2$-gas atmosphere. Oxygen may be added to the atmosphere gas in the reoxidation process so that the oxide film of the metal exposed to the surface of each base layer 7 is formed to a sufficient thickness.

Figure 4J:
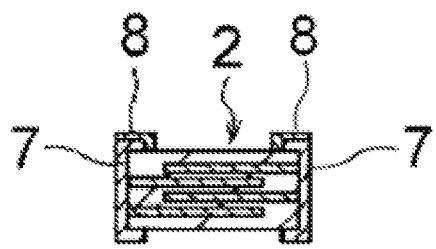
FIG. 4J is another cross-sectional view useful to describe the method of manufacturing the multilayer ceramic capacitor according to the second embodiment.
Figure 5A:
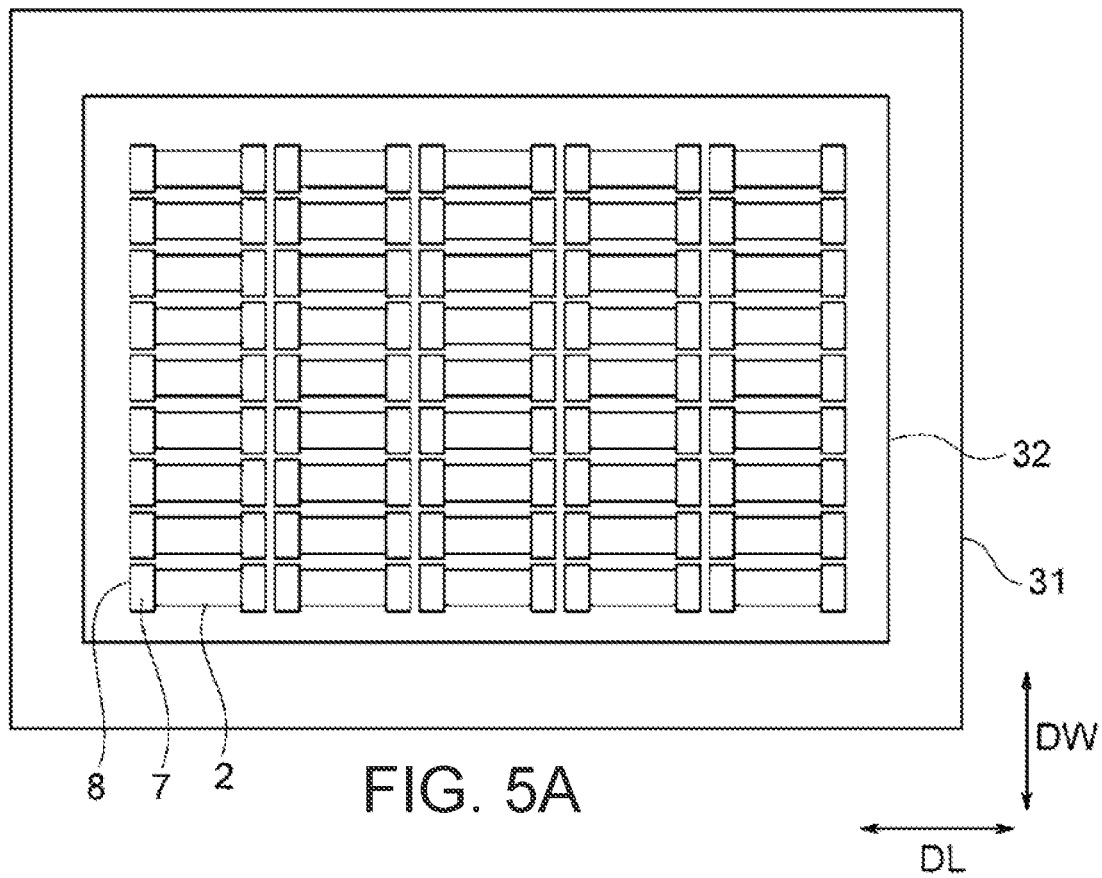
FIG. 5A is a plan view illustrating an example of the process of FIG. 4J.

Next, as indicated in Step S11 of FIG. 3 and shown in FIG. 4J, a process prior to the plating is carried out. Specifically, the oxide film is removed from the mounting surface M1, the side surface M2, the front surface M4 and the rear surface M4 of each base layer 7 through blasting (polishing) such that the metal included in the base layer 7 is exposed at the mounting surface M1, the side surface M2, the front surface M4 and the rear surface M4 of the base layer 7. In the blasting process, as illustrated in FIG. 5A, the element bodies 2 are placed on a substrate 31 inside a blast processing device such that the mounting surface M1 of each element body 2 faces upward and the upper surface M3 is in contact with the substrate 31. Then, blast media are projected onto the element bodies 2 directly from the above. The blast media projected directly from the above reach the side surface, the front surface and the rear surface of each of the element bodies 2 but do not reach the upper surface M3. Therefore, the oxide film on the base layer 7 can be removed from the mounting surface M1, the side surface M2, the front surface M4 and the rear surface M4 of each base layer 7, while the oxide film remains on the upper surface M3 of the base layer 7. Here, when the oxide film 7 is to remain on the front and rear surfaces M4, a resist may be used to cover and protect the front and rear surfaces M4 from the blasting.

Figure 4K:
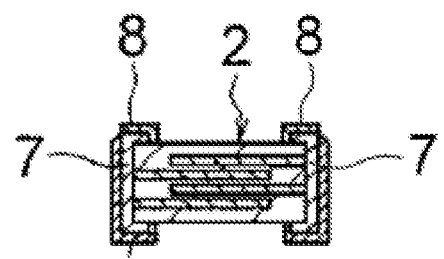
FIG. 4K is another cross-sectional view useful to describe the method of manufacturing the multilayer ceramic capacitor according to the second embodiment.

Next, as indicated in Step S12 of FIG. 3 and shown in FIG. 4K, the plating layer 9 is formed on the mounting surface M1 and the side surface M2 of each of the base layers 7. Each plating layer 9 can be formed, for example, by performing Cu plating, Ni plating, and Sn plating sequentially. In this plating process, the element body 2 in which the oxide films are removed from the mounting surfaces M1 and the side surfaces M2 of the base layers 7 may be placed in a barrel along with a plating solution. Then, the barrel may be rotated with the electricity supplied thereto. Thus, the plating layers 9 can be formed on the base layers 7 of each element body 2. In this plating process, no plating layer is formed on the base layers 7 on the upper surfaces M3 of the element body 2 since the oxide films are present on the upper surfaces M3 of the base layers 7.

Figure 5B:
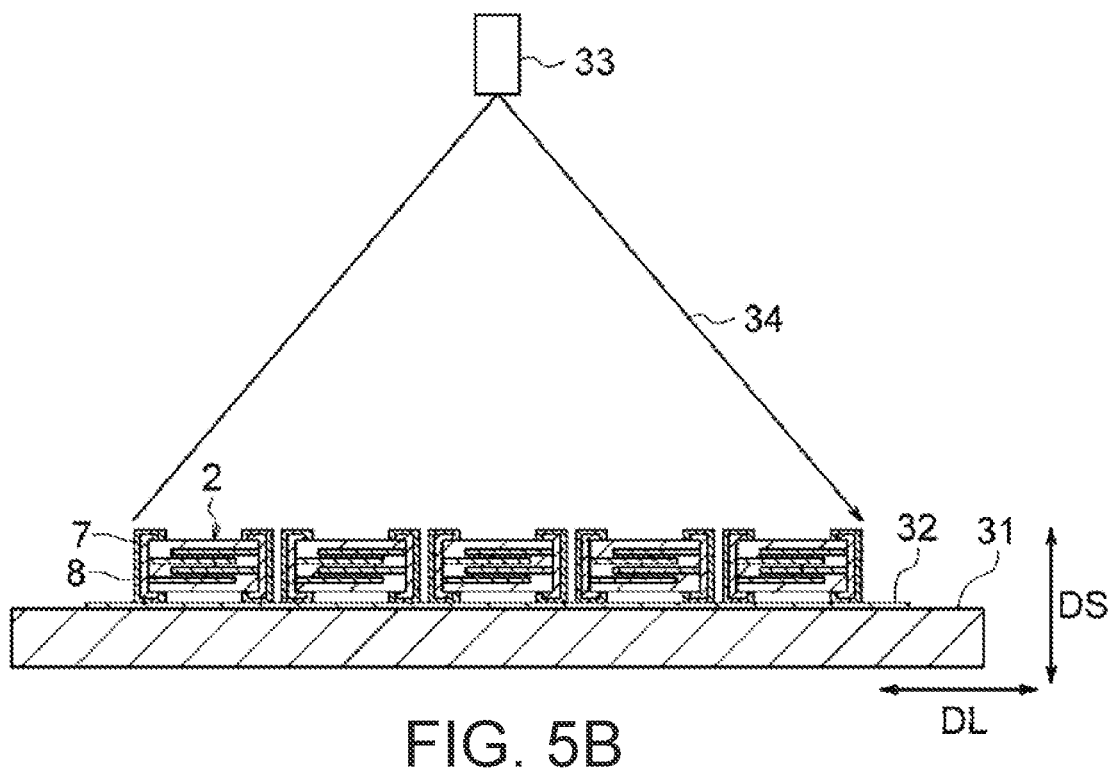
FIG. 5B is a cross-sectional view illustrating the process of FIG. 5A, taken along the lengthwise direction.

FIG. 5A is a plan view illustrating an example of the process of FIG. 4J. FIG. 5B is a cross-sectional view illustrating the process of FIG. 5A, taken along the lengthwise direction.

As illustrated in FIGS. 5A and 5B, a plurality of element bodies 2 are arranged on the substrate 31. In each of the element bodies 2, the oxide film is formed on the surface of each base layer 7. When arranging the element bodies 2 on the substrate 31, the upper surfaces M3 of each of the element bodies 2 are affixed to the substrate 31 via a fixing tape 32 such that the mounting surfaces M1 of the element body 2 are oriented upward. Then, the blast media 34 are projected onto the element bodies 2 from a nozzle 33 located directly above the element bodies 2. The blast media 34 are, for example, zircon particles or alumina particles.

The conditions for projecting the blast media in the blasting process may include the projection speed, the projection amount, and the projection region. The projection speed is set by adjusting the pressure and the path of the blast media 34. The projection amount is set by adjusting the media circulation and the projection time. The projection region is set by adjusting the nozzle shape and the distance between the element bodies 2 and the nozzle 33.

The blast media 34 projected from the nozzle 33 reach the opposite side surfaces, the front surface, and the rear surface of each of the element bodies 2. Therefore, the oxide films on the base layers 7 are removed from the mounting surfaces M1, the two side surfaces M2, the front surfaces M4 and the rear surfaces M4 of each element body 2, while the oxide films remain on the upper surfaces M3 of the base layers 7. An amount of blasting (polishing) the oxide film from the mounting surface M1, the side surface M2, the front surface M4 and the rear surface M4 of each base layer 7 can be set within a range that allows the plating layer 9 to be formed on the mounting surface M1, the side surface M2, the front surface M4 and the rear surface M4 of the base layer 7.

According to the above-described second embodiment, the oxide films on the base layers 7 are removed from the mounting surfaces M1, the side surfaces M2, the front surfaces M4 and the rear surfaces M4 of the external electrodes 6A and 6B by the blasting process. Thus, the plating layers 9 can be formed selectively and efficiently on the mounting surfaces M1, the side surfaces M2, the front surfaces M4 and the rear surfaces M4 of the external electrodes 6A and 6B, while the upper surfaces M3 of the external electrodes 6A and 6B remain covered with the covering layers 8. Accordingly, the above-described manufacturing method can keep the number of manufacturing processes from increasing and prevent the circuit board on which electronic components are mounted from having a height greater than a designed value. Also, the electronic components can be mounted on the circuit board at a high density.

In the above-described manufacturing method, the blasting process is used to remove the covering layers 8 from the mounting surfaces M1, the side surfaces M2, the front surfaces M4 and the rear surfaces M4 of the external electrodes 6A and 6B, but the present invention is not limited to such manufacturing method. Instead of the blasting process, isotropic dry etching, such as plasma etching may be used, or chemical polishing, such as wet etching, may be used.

Third Embodiment

Figure 6A:
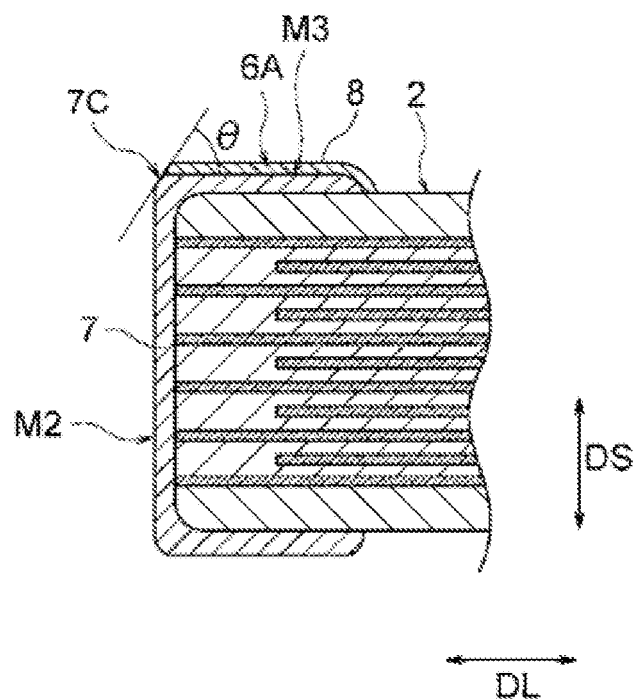
FIG. 6A is a cross-sectional view illustrating an exemplary configuration of an end of a covering layer of a multilayer ceramic capacitor according to a third embodiment of the present invention.

FIG. 6A is a cross-sectional view illustrating an exemplary configuration of an end of a covering layer of a multilayer ceramic capacitor according to a third embodiment of the present invention.

Referring to FIG. 6A, the base layer 7 includes a chamfered surface 7C on a ridge portion of the base layer 7. The chamfered surface 7C of the base layer 7 may have a shape which is obtained by cutting out a ridge portion of the base layer 7 or may have a curved shape. For example, the radius of curvature of the chamfered surface 7C of the base layer 7 can be in a range of from 1 μm to 50 μm.

In FIG. 6A, at least a part of an end of the covering layer 8 extends along the chamfered surface 7C of the base layer 7. This configuration can keep the wet solder from reaching the upper surface M3 of the base layer 7 while ensuring that the wet solder reaches and covers a sufficient area from the side surface M2 of the base layer 7 to the left end of the covering layer 8.

An angle θ formed by the upper surface M3 of the external electrode 6A and a tangent of the chamfered surface 7C at a position where the left end of the covering layer 8 is in contact with the side surface M2 of the base layer 7 can be greater than 45 degrees. This configuration can effectively keep the solder from reaching the upper surface M3 from the side surface M2. The angle θ can be controlled by adjusting the conditions for projecting the blast media in the blasting process illustrated in FIGS. 5A and 5B.

Figure 6B:
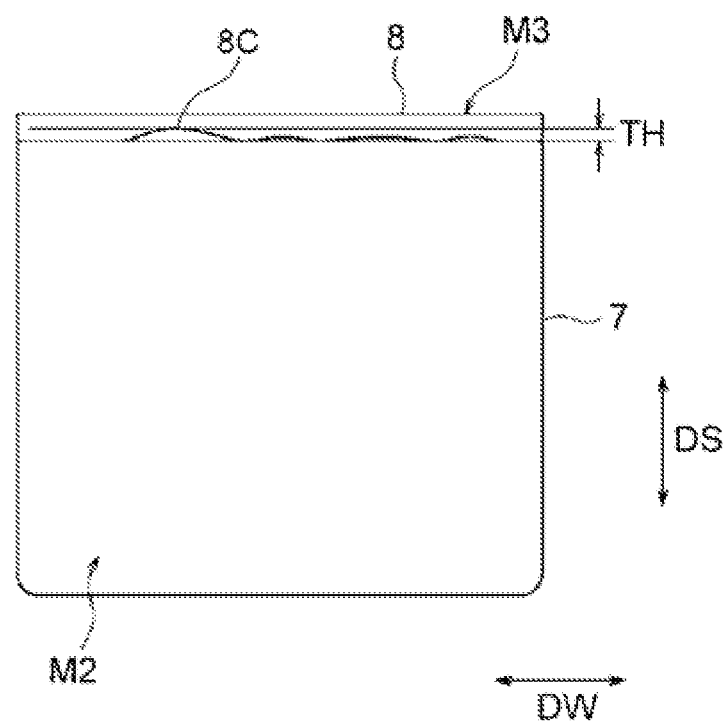
FIG. 6B is a cross-sectional view illustrating an exemplary configuration of an interface between a base layer and the end of the covering layer of the multilayer ceramic capacitor according to the third embodiment.

FIG. 6B is a cross-sectional view illustrating an exemplary configuration of an interface between the base layer 7 and the end of the covering layer 8 of the multilayer ceramic capacitor according to the third embodiment. FIG. 6B is taken along a plane which is parallel to the side surface M2 of the base layer 7.

Referring to FIG. 6B, corrugations 8C are formed at the end of the covering layer 8 on the chamfered surface 7C of the base layer 7. These corrugations 8C arise because of the variation in the blast media 34, illustrated in FIG. 5B, that have reached the side surface M2 of the element body 2. The range of a difference TH in the height of the corrugations 8C at the end of the covering layer 8 can be limited to a range of, for example, from 0.1 μm to 10 μm by changing the position of the nozzle 33 of the blasting machine during the blasting process to control the above-mentioned variation in the blast media 34. This can make it less likely that any crack extends linearly even if the solder has wet up to the end of the covering layer 8.

According to the above-described third embodiment, the end of the covering layer 8 is located along the chamfered surface 7C of the base layer 7. This configuration can ensure that a sufficient area becomes wet by the solder and can keep the solder from spreading out of the mounting region of the multilayer ceramic capacitor 1A.

Fourth Embodiment

Figure 7A:
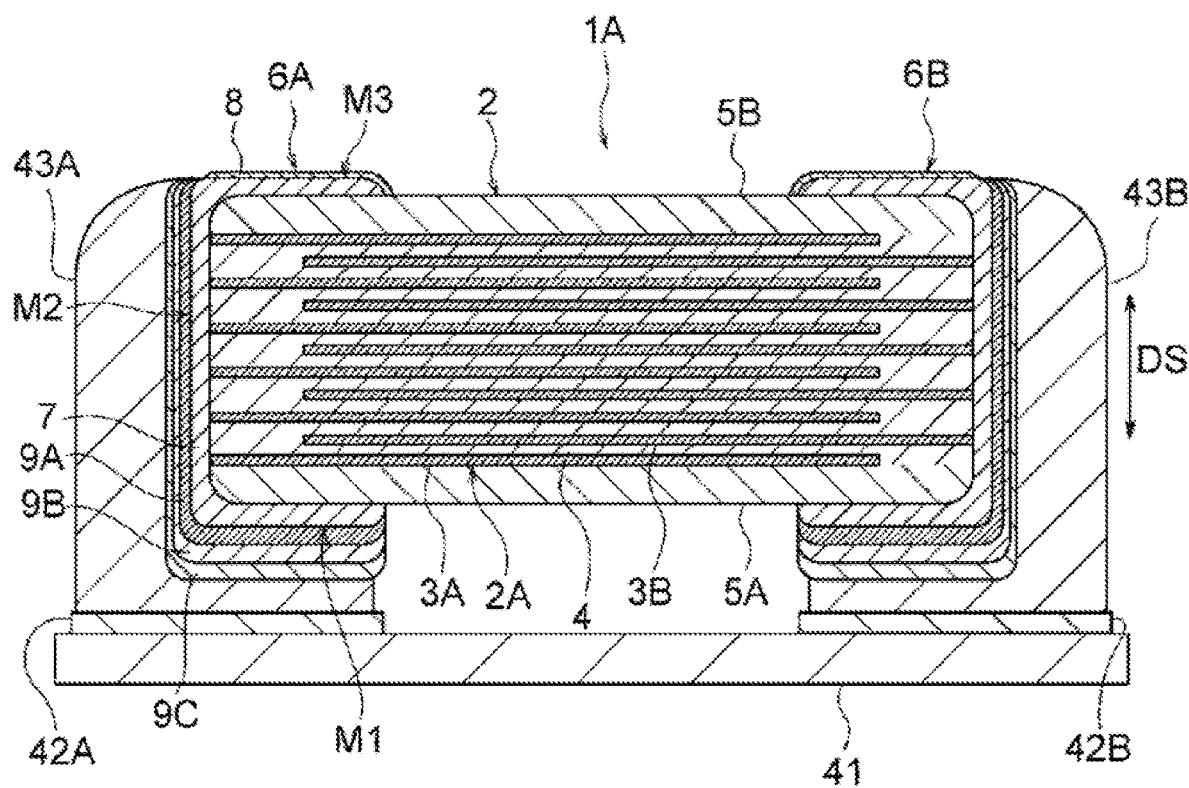
FIG. 7A is a cross-sectional view illustrating a configuration of a circuit board arrangement according to a fourth embodiment of the present invention, in which a multilayer ceramic capacitor is mounted on a circuit board.

FIG. 7A is a cross-sectional view illustrating a configuration of a circuit board arrangement according to a fourth embodiment of the present invention. The circuit board arrangement includes a circuit board 41 and a multilayer ceramic capacitor 1A mounted on the circuit board 41.

Referring to FIG. 7A, land electrodes 42A and 42B are formed on the circuit board 41. The multilayer ceramic capacitor 1A is connected to the land electrodes 42A and 42B via solder layers 43A and 43B stuck on the Sn-plating layers 9C and 9C of the external electrodes 6A and 6B, respectively. The upper surface M3 of each of the external electrodes 6A and 6B is covered with the covering layer 8. The plating layers 9A to 9C are formed on the mounting surface M1 and the side surface M2 of each of the external electrodes 6A and 6B. When the multilayer ceramic capacitor 1A is mounted onto the circuit board 41 by soldering, this configuration allows the solder to wet up to and be absorbed by the side surface M2 (and on the front surface M4 and the rear surface M4, if these surfaces are also plated with the plating layers 9A to 9C) of each of the external electrodes 6A and 6B while keeping the solder from wetting up to the upper surface M3 of each of the external electrodes 6A and 6B. Therefore, even if an excess amount of solder is supplied onto the land electrodes 42A and 42B, the solder can be kept from spreading out of the land electrodes 42A and 42B, while the circuit board 41 on which the multilayer ceramic capacitor 1A is mounted is kept from having a height greater than designed. A plurality of capacitors 1A may be mounted on the same circuit board in a similar manner. Accordingly, the above-described configuration can reduce the spacing between the electronic components 1A mounted on the circuit board 41 and increase the density of the mounted electronic components 1A while suppressing a short circuit between the electronic components 1A mounted on the circuit board 41.

In this configuration, the wet solder can move up to conceal the Sn-plating layers 9C. Therefore, the area where the solder is absorbed can be increased, as compared with a configuration in which the covering layers 8 are formed on the side surfaces M2 of the external electrodes 6A and 6B.

Moreover, as the wet solder moves up to the side surfaces M2 of the external electrodes 6A and 6B, the multilayer ceramic capacitor 1A can be supported on the circuit board 41 at the mounting surfaces M1 and the side surfaces M2 of the external electrodes 6A and 6B. Therefore, as compared with an arrangement in which the multilayer ceramic capacitor 1A is supported on the circuit board 41 only at the mounting surfaces M1 of the external electrodes 6A and 6B, the mounting strength of the multilayer ceramic capacitor 1A can be enhanced. Thus, even if the circuit board 41 is used as an in-vehicle circuit board and the circuit board 41 experiences vibrations or the like during traveling of a vehicle, the multilayer ceramic capacitor 1A can resist against the vibrations and does not fall from the circuit board 41.

Furthermore, any stress exerted on the element body 2 from the above can be absorbed by the base layers 7 and the covering layers 8 on the upper surfaces M3 of the external electrodes 6A and 6B. Therefore, the configuration of this embodiment can reduce a possibility that any crack arises in the element body 2.

According to the above-described fourth embodiment, the covering layers 8 are provided on the upper surfaces M3 of the external electrodes 6A and 6B while allowing the solder to wet the mounting surfaces M1 and the side surfaces M2 of the external electrodes 6A and 6B. Thus, the mounting density of the electronic components 1A on the circuit board 41 can be increased while enhancing the reliability of the multilayer ceramic capacitors 1A mounted on the circuit board 41.

First Comparative Example

Figure 7B:
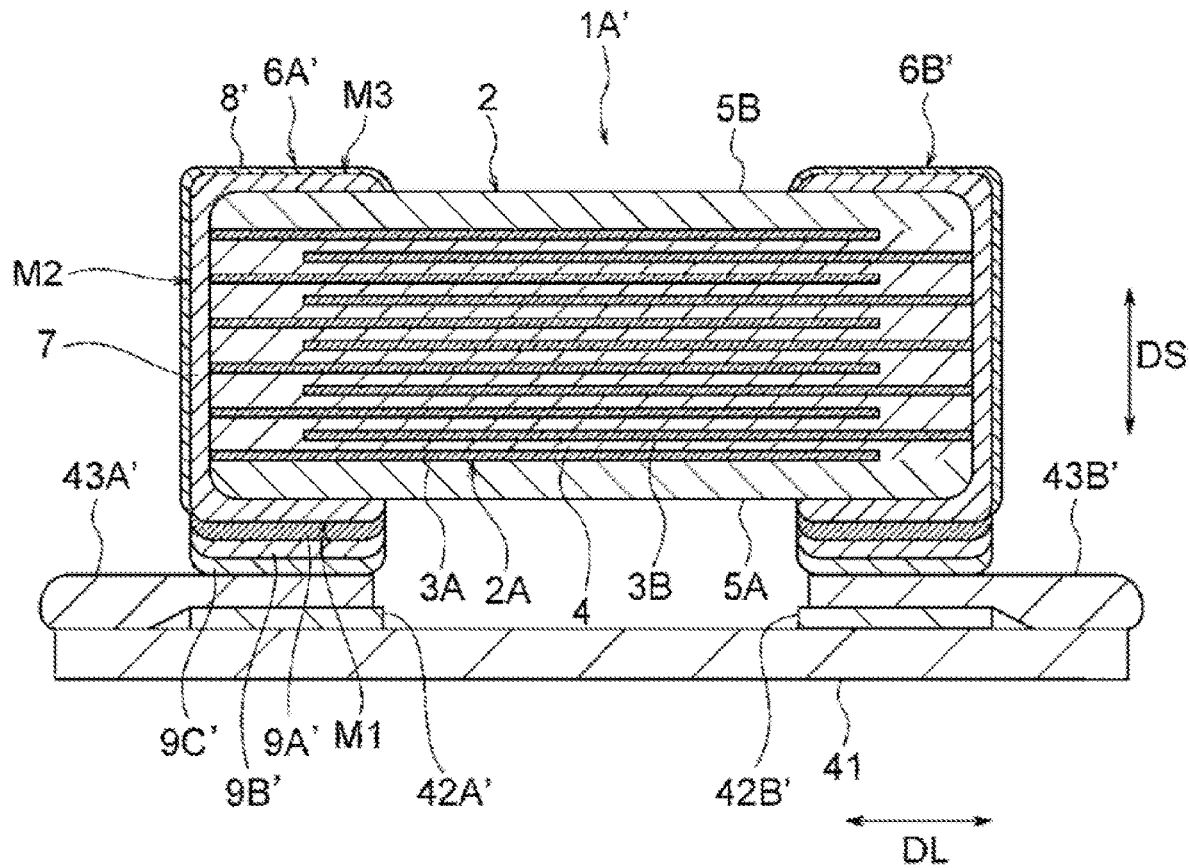
FIG. 7B is a cross-sectional view illustrating a configuration of a circuit board on which a multilayer ceramic capacitor according to a first comparative example is mounted.

FIG. 7B is a cross-sectional view illustrating a configuration of a circuit board arrangement in which a multilayer ceramic capacitor 1A' according to a first comparative example is mounted on a circuit board 41.

Referring to FIG. 7B, a multilayer ceramic capacitor 1A' includes external electrodes 6A' and 6B' in place of the external electrodes 6A and 6B illustrated in FIG. 7A, respectively. Each of the external electrodes 6A' and 6B' includes a covering layer 8', a Cu-plating layer 9A', an Ni-plating layer 9B', and an Sn-plating layer 9C' in place of the covering layer 8, the Cu-plating layer 9A, the Ni-plating layer 9B, and the Sn-plating layer 9C illustrated in FIG. 7A, respectively.

The surfaces (such as side surfaces M2 and upper surfaces M3) of the external electrodes 6A' and 6B' other than the mounting surfaces M1 are covered with the covering layers 8'. The Cu-plating layers 9A', the Ni-plating layers 9B', and the Sn-plating layers 9C' are formed on the mounting surfaces M1 of the base layers 7 of the external electrodes 6A' and 6B'.

Land electrodes 42A' and 42B' are formed on the circuit board 41. The multilayer ceramic capacitor 1A' is connected to the land electrodes 42A' and 42B' via solder layers 43A' and 43B' stuck on the Sn-plating layers 9C' of the external electrodes 6A' and 6B'. Since the side surfaces M2 of the external electrodes 6A' and 6B' are covered with the covering layers 8', no solder wets up to the side surfaces M2 of the external electrodes 6A' and 6B'. Therefore, if an excess amount of solder is supplied, the solder layers 43A' and 43B' spread out onto the circuit board 41 from the mounting surfaces M1, and this may hinder the high density mounting of the electronic components 1A' on the circuit board 41.

(This configuration may, however, still be useful depending on circumstances and mounting procedures, such as when the amount of the solder can be relatively easily controlled during the mounting.)

Second Comparative Example

Figure 7C:
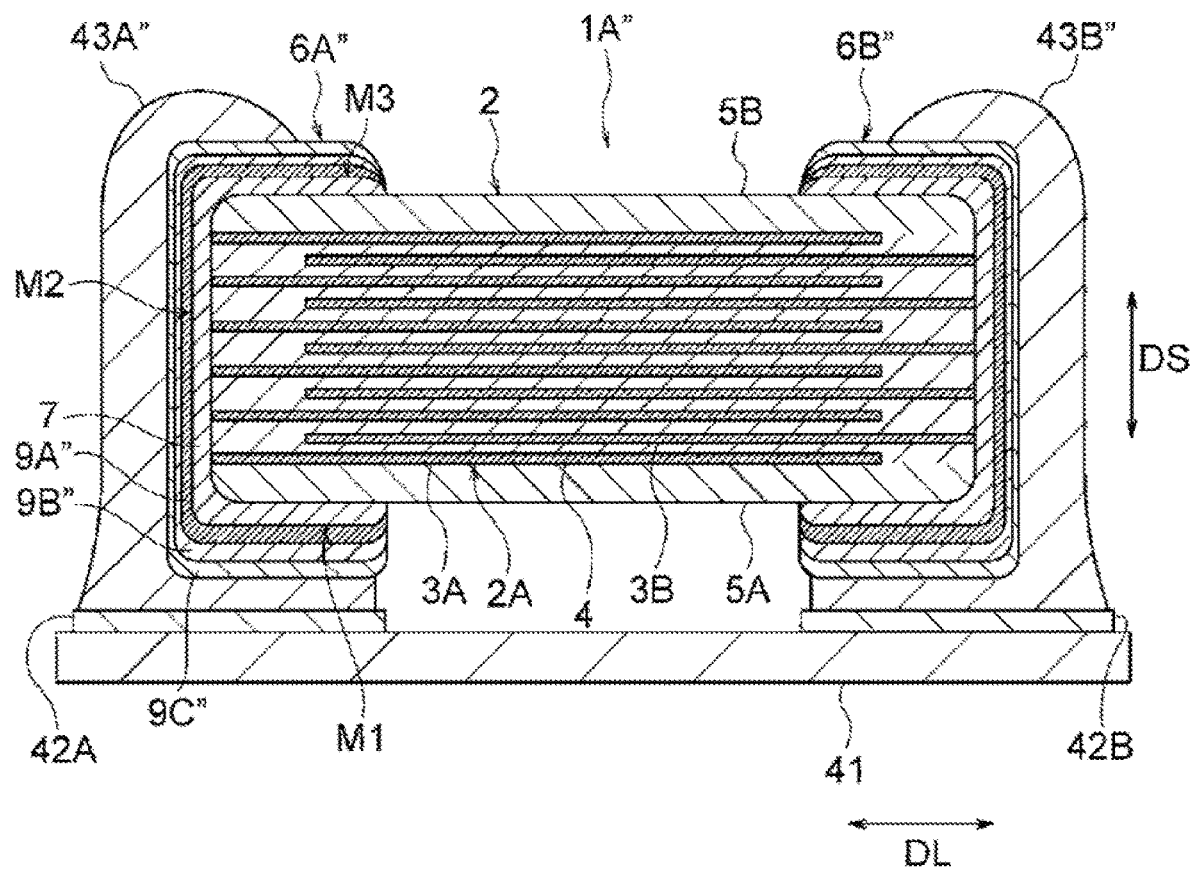
FIG. 7C is a cross-sectional view illustrating a configuration of a circuit board on which a multilayer ceramic capacitor according to a second comparative example is mounted.

FIG. 7C is a cross-sectional view illustrating a configuration of a circuit board arrangement in which a multilayer ceramic capacitor 1A" according to a second comparative example is mounted on a circuit board 41.

Referring to FIG. 7C, a multilayer ceramic capacitor 1A" includes external electrodes 6A" and 6W' in place of the external electrodes 6A and 6B illustrated in FIG. 7A, respectively. Each of the external electrodes 6A" and 6B" includes a Cu-plating layer 9A", an Ni-plating layer 9B", and an Sn-plating layer 9C" in place of the covering layer 8, the Cu-plating layer 9A, the Ni-plating layer 9B, and the Sn-plating layer 9C illustrated in FIG. 7A.

The Cu-plating layers 9A", the Ni-plating layers 9B", and the Sn-plating layers 9C" are formed on the mounting surfaces M1, the side surfaces M2, and the upper surfaces M3 of the base layers 7 of the external electrodes 6A" and 6B".

The multilayer ceramic capacitor 1A" is connected to the land electrodes 42A and 42B via solder layers 43A" and 43B" stuck on the Sn-plating layers 9C" and 9C" of the external electrodes 6A" and 6B". In this configuration, the solder wets up to the upper surfaces M3 via the side surfaces M2 and M2 of the external electrodes 6A" and 6B", and the solder layers 43A" and 43B" that bulge from the upper surfaces M3 and M3 of the external electrodes 6A" and 6B" are formed. Accordingly, the circuit board arrangement in which the multilayer ceramic capacitor 1A" is mounted on the circuit board 41 may have a height greater than originally designed.

Fifth Embodiment

Figure 8:
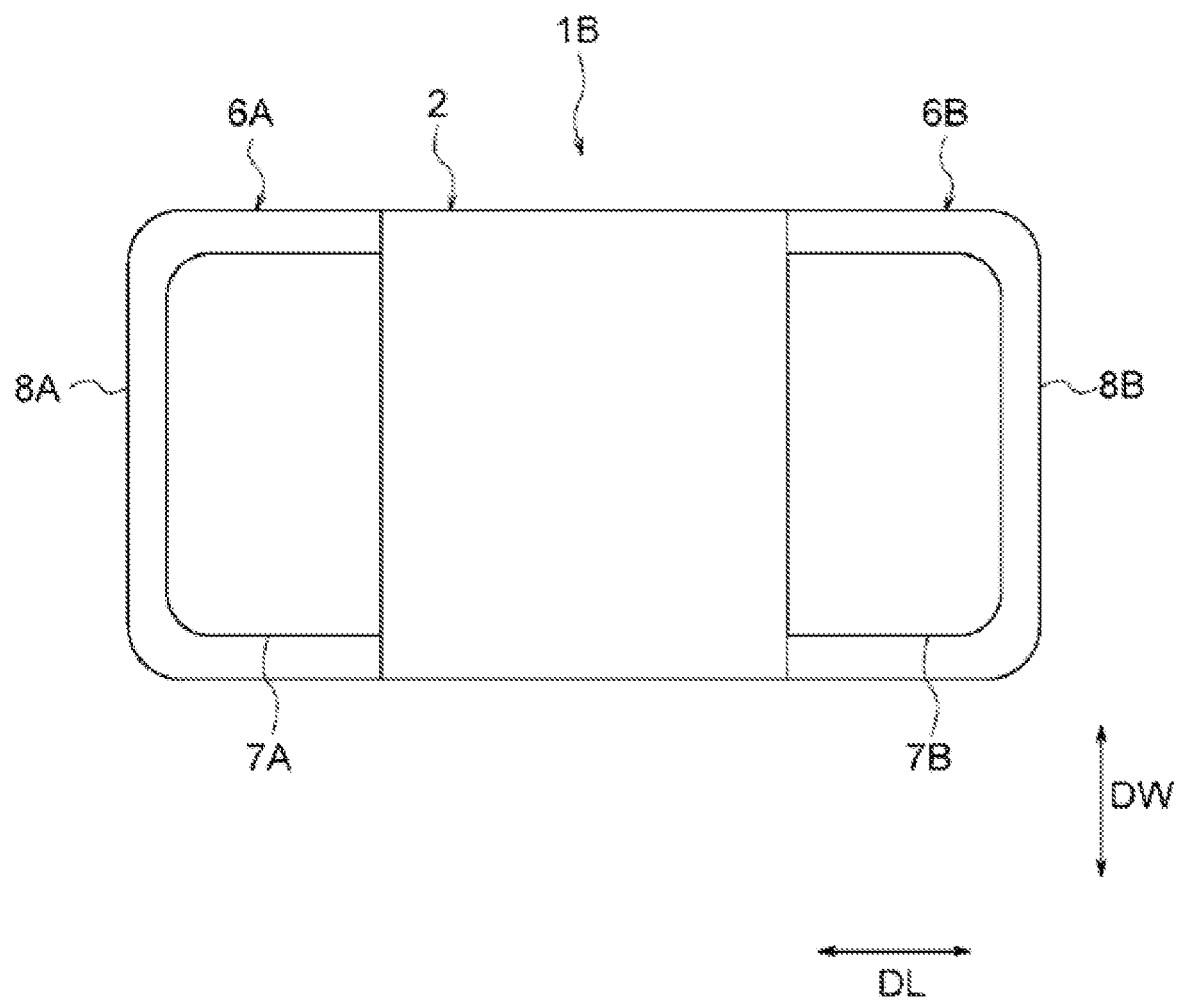
FIG. 8 is a plan view illustrating a configuration of a multilayer ceramic capacitor according to a fifth embodiment of the present invention.

FIG. 8 is a plan view illustrating a configuration of a multilayer ceramic capacitor 1B according to a fifth embodiment of the present invention, looking toward covering layers 8A and 8B.

Referring to FIG. 8, the multilayer ceramic capacitor 1B includes the covering layers 8A and 8B, in place of the covering layers 8 illustrated in FIG. 1. The multilayer ceramic capacitor 1B can have a configuration similar to the configuration of the multilayer ceramic capacitor 1A illustrated in FIG. 1 except that the multilayer ceramic capacitor 1B includes the covering layers 8A and 8B in place of the covering layers 8 illustrated in FIG. 1. Each of the covering layers 8A and 8B in this embodiment is a U-shaped belt-like pattern (90 degrees rotated U-shape) covering the peripheral edges (sides) of the top face of the base layer 7 and does not cover the center portion of the base layer 7 on the upper surface M3. So the top side of each side surface M2 meets the cover layer 8A or 8B. In more detail, the outer peripheries of the upper surface M3 of each of the external electrodes 6A and 6B include a side (edge) that is in contact with the side surface M2, a side that is in contact with the front surface M4, and a side that is in contact with the rea surface M4. Each of these sides (and/or adjacent regions) is covered by the covering layer 8A/8B. When this configuration is viewed from the above, the belt-like pattern of each of the covering layers 8A and 8B forms a rectangular shape with one open side, covering these peripheral edges (or adjacent regions) of the upper surface M3.

If the covering layers 8 and 8 are formed on the upper surfaces M3 and M3 of the external electrodes 6A and 6B, respectively, the peripheral belt-shaped regions of the covering layer 8 formed in step S10 above on the upper surfaces M3 and M3 of the external electrodes 6A and 6B may be covered with resist films, and then the upper surfaces M3 and M3 of the external electrodes 6A and 6B may be subjected to the blasting process through the method described in conjunction with FIG. 5A and FIG. 5B so as to remove the covering layer 8 at the center portion of upper surface M3, thereby leaving the belt-like pattern of the covering layer 8A/8B at the peripheries on the upper surfaces M3.

According to the above-described fifth embodiment, the covering layers 8A and 8B are formed on the upper surfaces M3 and M3 of the external electrodes 6A and 6B, respectively, and the plating layers 9 and 9 are formed on the mounting surfaces M1 and M1 and the side surfaces M2 and M2 of the external electrodes 6A and 6B, respectively. Accordingly, any increase in the height of the multilayer ceramic capacitor 1B mounted on the circuit board can be prevented while keeping solder from spreading out of the mounting region of the multilayer ceramic capacitor 1B. The electronic components can be mounted on the circuit board at a high density while keeping the circuit board arrangement in which the electronic components are mounted on the circuit board from having a height greater than designed.

In the above-described embodiments, each of the covering layers 8 (8A, 8B) includes an oxide film of a metal used as the conductive material of the base layers 7 (7A, 7B). Alternatively, the covering layers 8 (8A, 8B) may include a glass phase of a composition identical to the composition of a glass component included in the base layers 7 (7A, 7B).

Sixth Embodiment

Figure 9:
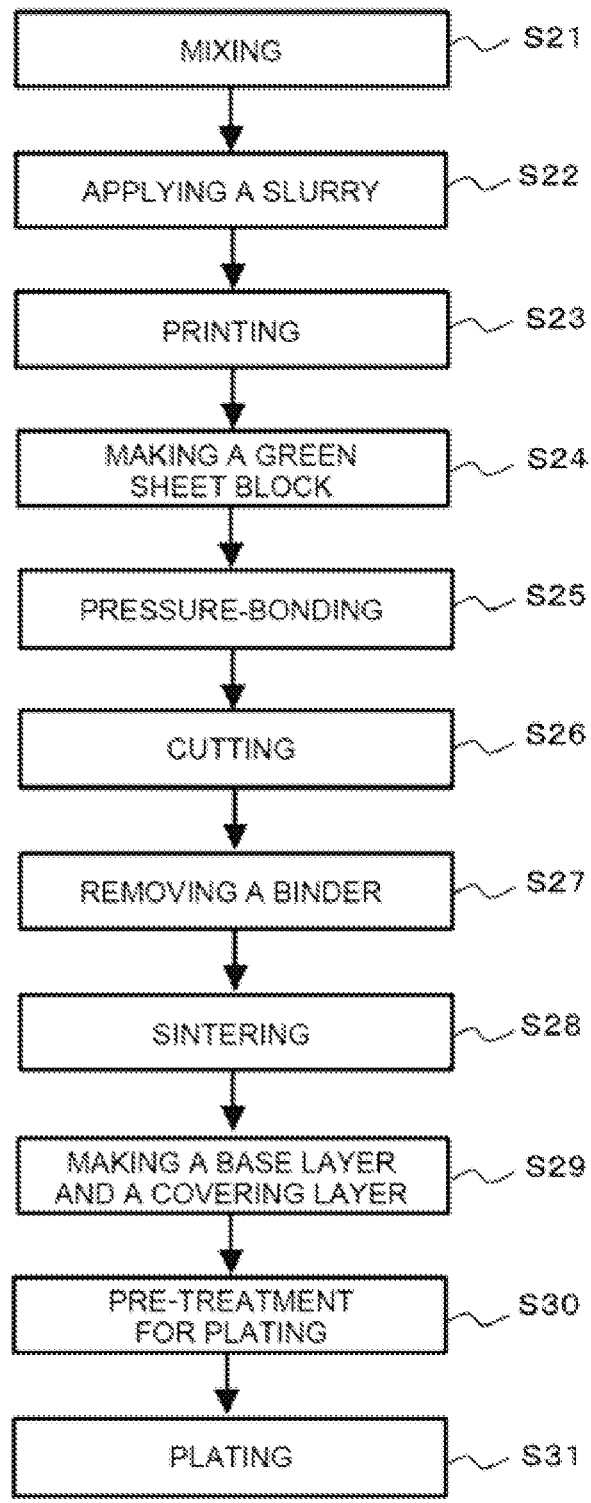
FIG. 9 is a flowchart illustrating a method of manufacturing a multilayer ceramic capacitor according to a sixth embodiment of the present invention.

FIG. 9 is a flowchart illustrating a method of manufacturing a multilayer ceramic capacitor according to a sixth embodiment of the present invention. It should be noted that the method described in conjunction with FIG. 3 forms the covering layers 8 that include an oxide film of a metal used as a conductive material of the base layers 7, and the method of FIG. 9 forms the covering layers 8 that include a glass phase of a composition identical to the composition of a glass component included in the base layers 7.

Step S21 to Step S27 of FIG. 9 are similar to Step S1 to Step S7 of FIG. 3, respectively. Specifically, Step S21 to Step S27 make the element body 2 from which the binder has been removed in a similar manner to Step S1 to Step S7. The element body 2 has six surfaces.

Next, as indicated in Step S28 of FIG. 9, the element body 2 from which the binder has been removed at Step S27 of FIG. 9 is sintered to integrate the inner electrode layers 3A and 3B with the dielectric layers 4. The element body 2 is sintered, for example, in a firing furnace in a temperature range from 1000 degrees C. to 1350 degrees C. for ten minutes to two hours. If a base metal, such as Ni or Cu, is used in the inner electrode layers 3A and 3B, the element body 2 may be sintered in the firing furnace, with the inside of the firing furnace being kept to the reducing atmosphere in order to prevent oxidation of the inner electrode layers 3A and 3B.

After Step S28, as indicated in Step S29 of FIG. 9, a conductive paste for the base layer is applied to two opposite side surfaces of the element body 2 and to the edge portions of the remaining four surfaces adjacent to the two side surfaces, and the conductive paste for the base layer is then dried. The conductive paste for the base layer includes powder or a filler of a metal used as the conductive material of the base layers 7. For example, if the metal used as the conductive material of the base layers 7 is Cu, the conductive paste for the base layer includes Cu powder or a Cu filler. The conductive paste for the base layer includes a sintering assistant made of glass (e.g., $SiO_2$ or the like). An amount of the sintering assistant made of glass can be in a range of, for example, from 11 wt % to 13 wt %.

Next, the element body 2 to which the conductive paste for the base layer has been applied is sintered to form the base layers 7 integrated with the element body 2. Here, the element body 2 is sintered, for example, in a firing furnace at 850 degrees C. for no less than 15 minutes. Onto the surface of each of the base layers 7 sintered under such a condition, a glass phase of a composition identical to the composition of the glass component included in the base layer 7 surfaces, thereby forming a covering layer 8 on the base layer 7. The surface of each base layer 7 where the glass phase has surfaced (i.e., where the covering layer 8 is formed) does not get plated or soldered during mounting. It should be noted that the glass phase surfaces more easily onto the surface of the base layer 7 as the sintering temperature is higher, as the sintering time is longer, or as an amount of the sintering assistant made of glass is larger. Therefore, the thickness of the glass phase (the covering layer 8) can be controlled by adjusting the sintering temperature, the sintering time, and the amount of the sintering assistant made of glass.

Next, as indicated in Step S30 and Step S31 of FIG. 9, the process prior to the plating and the subsequent plating process are performed through the processes similar to those at Step S11 and Step S12 of FIG. 3.

According to the above-described sixth embodiment, the covering layers 8 that include a glass phase of a composition identical to the composition of the glass component included in the base layers 7 are formed, and the remaining configurations can be similar to the configurations of the first to fifth embodiments. Such covering layers 8 can also keep solder from wetting up to those surfaces of the external electrodes 6A and 6B which are covered with the covering layers 8.

Seventh Embodiment

Figure 10:
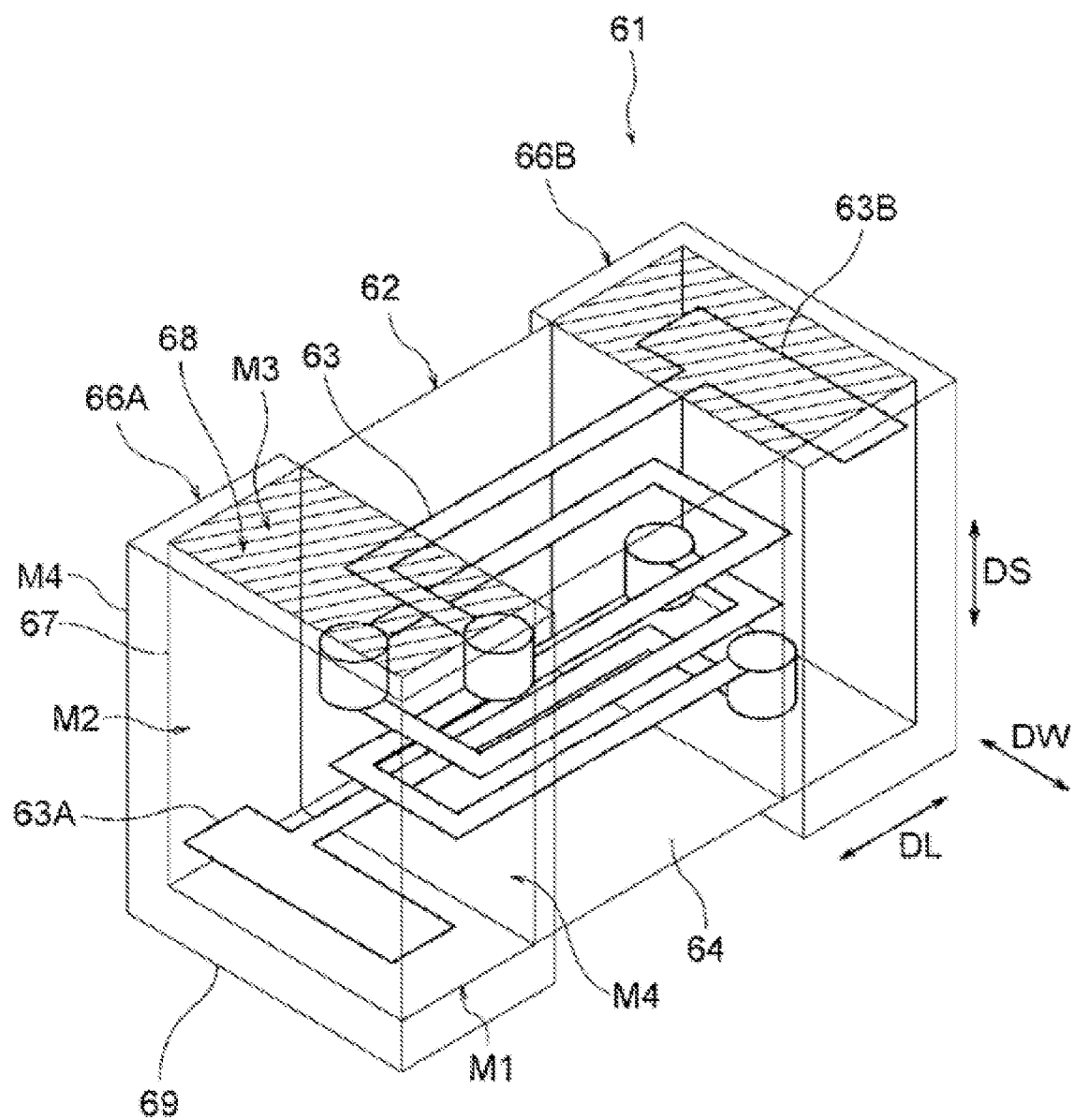
FIG. 10 is a perspective view illustrating a configuration of an electronic component according to a seventh embodiment of the present invention.

FIG. 10 is a perspective view illustrating a configuration of an electronic component 61 according to a seventh embodiment of the present invention. In the seventh embodiment, a chip inductor 61 will be described as an example of the electronic component.

Referring to FIG. 10, the chip inductor 61 includes an element body 62 and external electrodes 66A and 66B. The element body 62 includes a coil pattern 63, inner electrode layers 63A and 63B, and a magnetic material 64. The element body 62 may have a substantially rectangular parallelepiped shape. The external electrodes 66A and 66B are located on the opposing side surfaces of the element body 62 such that the external electrode 66A is separated from the external electrode 66B. Each of the external electrodes 66A and 66B is present on the associated side surface of the element body 62 and extends onto the front surface, the rear surface, the upper surface and the lower surface of the element body 62 from the side surface M2.

The coil pattern 63 and the inner electrode layers 63A and 63B are covered with the magnetic material 64. Yet, an end of the inner electrode layer 63A is pulled out from the magnetic material 64 at one side surface of the element body 62 and connected to the external electrode 66A. An end of the inner electrode layer 63B is pulled out from the magnetic material 64 at the other side surface of the element body 62 and connected to the external electrode 66B.

A material for the coil pattern 63 and the inner electrode layers 63A and 63B can be selected, for example, from metals, such as Cu, Ni, Ti, Ag, Au, Pt, Pd, Ta, and W, or may be an alloy that includes any of these metals. The magnetic material 64 is, for example, ferrite.

Each of the external electrodes 66A and 66B includes a base layer (underlayer) 67 and a plating layer 69. Each of the external electrodes 66A and 66B has a mounting surface M1, a side surface M2, an upper surface M3, a front surface M4 and a rear surface M4. The mounting surface M1 is a surface that faces a circuit board on which the chip inductor 61 is to be mounted. The upper surface M3 is a face opposite to the mounting surface M1.

A conductive material for the base layers 67 can include, as a main component, a metal or an alloy that contains at least one selected from Cu, Fe, Zn, Al, Ni, Pt, Pd, Ag, Au, and Sn, for example. Each of the base layers 67 includes a co-material. The co-material is, for example, a ceramic component which is as a main component of the magnetic material 64. Each of the base layers 67 may include a glass component. The glass component is, for example, an oxide of Ba, Sr, Ca, Zn, Al, Si, B, or the like.

The surface (upper surface M3) of each of the external electrodes 66A and 66B other than the mounting surface M1, the side surface M2, the front surface M4 and the rear surface M4 is covered with a covering layer 68. The covering layer 68 may include an oxide film of a metal used as the conductive material of the base layer 67 or include a glass phase of a composition identical to the composition of the glass component included in the base layer 67. The plating layer 69 is formed on the mounting surface M1, the side surface M2, the front surface M4 and the rear surface M4 of the base layer 67 in each of the external electrodes 66A and 66B.

According to the above-described seventh embodiment, the covering layers 68 are provided on the upper surfaces M3 of the external electrodes 66A and 66B of the chip inductor 61. This makes it possible to prevent an increase in the height of the chip inductor 61 mounted on a circuit board while keeping solder from spreading out of the mounting region of the chip inductor 61.

Eighth Embodiment

Figure 11:
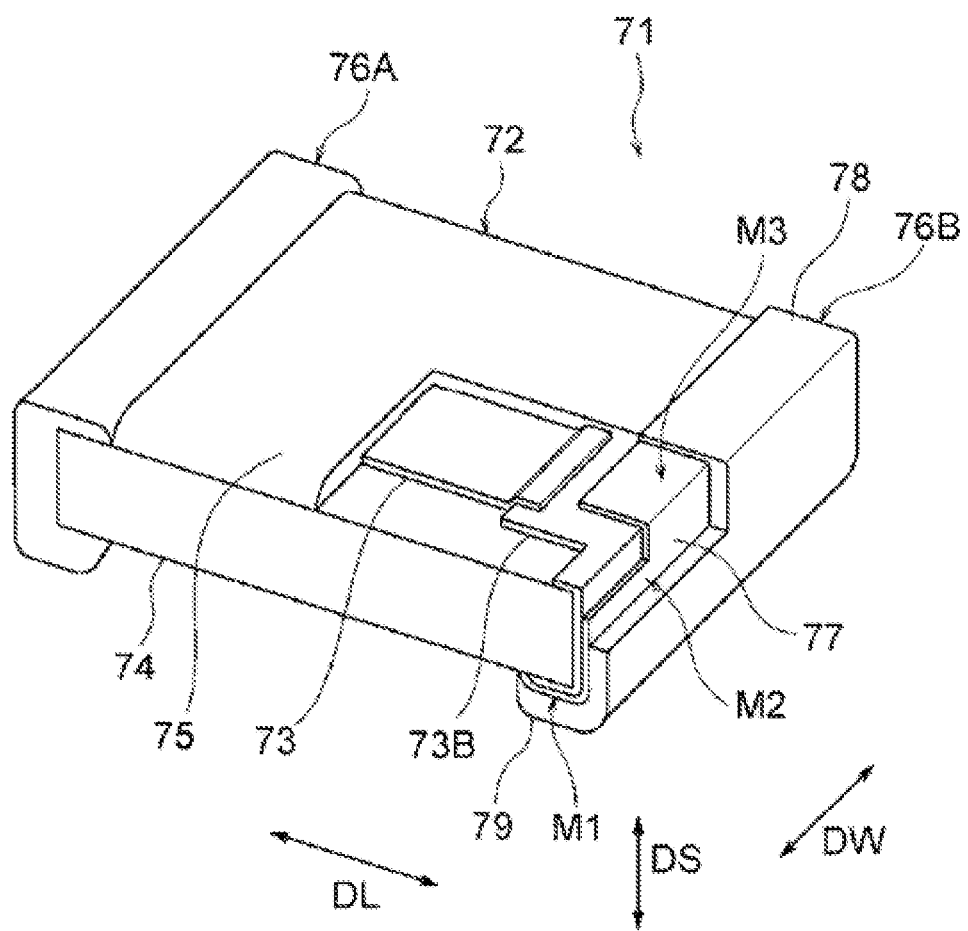
FIG. 11 is a perspective view illustrating a configuration of an electronic component according to an eighth embodiment of the present invention.

FIG. 11 is a partially cutout perspective view illustrating a configuration of an electronic component 71 according to an eighth embodiment of the present invention. FIG. 11 illustrates a chip resistor 71 as an example of the electronic component.

Referring to FIG. 11, the chip resistor 71 includes an element body 72, external electrodes 76A and 76B, and a protection film 75. The element body 72 includes a resistor body 73, an inner electrode layer 73B, and a substrate 74. The element body 72 can have a substantially rectangular parallelepiped shape. The external electrodes 76A and 76B are located on the opposing side surfaces of the element body 72 such that the external electrodes 76A and 76B are separated from each other. Each of the external electrodes 76A and 76B is present on the associated side surface of the element body 72 and extends onto the upper and lower surfaces of the element body 72 from the side surface.

The resistor body 73 and the inner electrode layer 73B are disposed on the substrate 74 and covered with the protection film 75. One end of the resistor body 73 is connected to the inner electrode layer 73B on the substrate 74. The inner electrode layer 73B extends onto one of the side surfaces of the element body 72 and is connected to the external electrode 76B. It should be noted that another inner electrode layer (not illustrated) is connected to the other end of the resistor body 73 and extends to the other one of the side surfaces of the element body 72 such that this inner electrode layer is connected to the external electrode 76A.

A material for the resistor body 73 may be selected, for example, from metals, such as Ag and Pd, or may be an alloy that includes any of these metals. Alternatively, the material for the resistor body 73 may be a metal oxide, such as ruthenium oxide. A material for the inner electrode layer 73B can be selected, for example, from metals, such as Cu, Ni, Ti, Ag, Au, Pt, Pd, Ta, and W, or may be an alloy that includes any of these metals. A material for the substrate 74 is, for example, a ceramic oxide, such as alumina. A material for the protection film 75 is, for example, glass or resin.

Each of the external electrodes 76A and 76B includes a base layer 77 and a plating layer 79. Each of the external electrodes 76A and 76B has a mounting surface M1, a side surface M2, and an upper surface M3. The mounting surfaces M1 are surfaces that are to oppose a circuit board on which the chip resistor 71 is to be mounted. The upper surfaces M3 are surfaces that are opposite to the mounting surfaces M1.

A conductive material for the base layers 77 can include, as a main component, a metal or an alloy that contains at least one selected from Cu, Fe, Zn, Al, Ni, Pt, Pd, Ag, Au, and Sn, for example. Each of the base layers 77 includes a co-material. The co-material is, for example, a ceramic component which is a main component of the substrate 74. The base layer 77 may include a glass component. This glass component is, for example, an oxide of Ba, Sr, Ca, Zn, Al, Si, B, or the like.

The surface (upper surface M3) of each of the external electrodes 76A and 76B other than the mounting surface M1 and the side surface M2 is covered with a covering layer 78. Each of the covering layers 78 may include an oxide film of a metal used as the conductive material of the base layer 77 or include a glass phase of a composition identical to the composition of the glass component included in the base layer 77. The plating layer 79 is formed on the mounting surface M1 and the side surface M2 of the base layer 77 in each of the external electrodes 76A and 76B.

According to the above-described eighth embodiment, the covering layers 78 are provided on the upper surfaces M3 of the external electrodes 76A and 76B of the chip resistor 71. This makes it possible to prevent an increase in the height of the chip resistor 71 mounted on a circuit board while keeping solder from spreading out of the mounting region of the chip resistor 71.

In the above-described embodiments, the above-mentioned covering layers are provided on the upper surfaces of the external electrodes in order to prevent the solder from wetting up to the upper surfaces of the external electrodes. Alternatively, a covering layer that is made of a different material or composition and/or has a different surface profile may be provided on the upper surface of each external electrode, as long as it has less wettability to solder than the plating layer on each external electrode. The wettability to solder can be assessed/measured based, for example, on the angle of contact. In the above-mentioned alternative configuration, the angle of contact of solder on the covering layer is greater than the angle of contact of solder on the plating layer. The angle of contact can be measured as follows, for example. An item is immersed in a bath of molten solder and then lifted up from the bath. Subsequently, a cross-section of the item which is perpendicular to the surface to be observed is checked, and the angle at which the solder is in contact with that surface is measured as the angle of contact.

In the foregoing embodiments, a two-terminal component serves as an example of the electronic component. Alternatively, an electronic component with three or more terminals, such as a transistor or a transformer, may serve as the electronic component.

Each of the covering layers 8 may be constituted by a resist film that includes resin, instead of the materials described in the foregoing embodiments. When a resist film is used as the covering layer 8, the covering layer 8 can be formed to a desired thickness.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An electronic component comprising:
   an element body that includes a dielectric and at least one inner electrode; and
   at least one external electrode,
   wherein each of said at least one external electrode includes:
      a base layer formed on a side surface of the element body and extending from the side surface to cover one or more of adjacent surfaces of the element body, the base layer thereby having a plurality of faces facing different directions, including a bottom face on a mounting side of the external electrode, a top face opposite to the bottom face, and a side face on the side surface of the element body, the base layer being connected to one or more of said at least one inner electrode at the side surface of the element body and containing a metal,
      a plating layer formed on the bottom face of the base layer, and on the side face of the base layer that is on the side surface of the element body to which said at least one inner electrode is connected, the plating layer being an outermost layer of the external electrode exposed to an exterior and being absent on and over an entire top surface of the element body, and
      a covering layer formed on, and being in direct contact with, the top face of the base layer, the covering layer being absent on the plating layer, the covering layer extending to a ridge of the element body where the side surface of the element body meets the top surface of the element body, a surface of the covering layer being less wettable than a surface of the plating layer by solder.

2. The electronic component according to claim 1, wherein the base layer is also formed on a front surface and a rear surface of the element body, and the plating layer is also formed on a front face and a rear face of the base layer.

3. The electronic component according to claim 1, wherein the covering layer includes an oxide film of the metal of the base layer.

4. The electronic component according to claim 1, wherein the base layer includes a first co-material that coexists with the metal, and the covering layer includes a second co-material.

5. The electronic component according to claim 4, wherein the first co-material included in the base layer and the second co-material included in the covering layer have an identical composition.

6. The electronic component according to claim 4, wherein each of the first co-material and the second co-material is oxide ceramic that constitutes the dielectric.

7. The electronic component according to claim 1, wherein the covering layer is a resist film that includes a resin.

8. The electronic component according to claim 1, wherein the base layer includes a glass component, and the covering layer includes a glass phase that has a composition identical to a composition of the glass component included in the base layer.

9. The electronic component according to claim 1, wherein the metal in the base layer is a metal or an alloy that contains at least one of Cu, Fe, Zn, Al, and Ni.

10. The electronic component according to claim 1, wherein the plating layer includes an Ni-plating layer and an Sn-plating layer formed on the Ni-plating layer.

11. The electronic component according to claim 1, wherein the covering layer is disposed in a belt-like pattern on the top face of the base layer opposite to the bottom face of the base layer, such that the belt-like pattern covers peripheral edges of the top face of the base layer.

12. The electronic component according to claim 1, wherein the base layer has a chamfered surface on a ridge portion of the base layer, and at least a portion of an end of the covering layer extends along the chamfered surface of the base layer.

13. The electronic component of claim 12, wherein an angle formed by the top face of the base layer opposite to the bottom face and a tangent of the chamfered surface at a position where the end of the covering layer is in contact with the side face of the base layer on the side surface of the element body is greater than 45 degrees.

14. The electronic component according to claim 1,
wherein said at least one inner electrode includes at least one first inner electrode layer and at least one second inner electrode layer,
wherein the element body includes a laminate in which said at least one first inner electrode layer and said at least one second inner electrode layer are laminated in an alternating manner with the dielectric being interposed therebetween,
wherein said at least one external electrode includes a first external electrode and a second external electrode that are provided on opposing side surfaces of the laminate,
wherein said at least one first inner electrode layer is connected to the first external electrode and said at least one second inner electrode layer is connected to the second external electrode.

15. A circuit board arrangement comprising:
a circuit board; and
the electronic component as set forth in claim 1, mounted on the circuit board.

16. A method of manufacturing an electronic component, the method comprising:
forming an element body that includes a dielectric and at least one inner electrode;
applying an electrode material, which contains a metal, to a side surface of the element body and one or more of adjacent surfaces of the element body connecting to the side surface;
sintering the electrode material to form a base layer, which contains the metal, on the side surface of the element body and on the one or more of the adjacent surfaces of the element body, the base layer thereby having a plurality of faces facing different directions, including a bottom face on a mounting side, a top face opposite to the bottom face, and a side face on the side surface of the element body, the base layer being connected to one or more of said at least one inner electrode at the side surface of the element body;
forming a covering layer that covers the faces of the base layer;
removing the covering layer from bottom face of the base layer that is on the mounting side and from the side face of the base layer that is on the side surface of the element body, while leaving the covering layer on the top face of the base layer that is opposite to the bottom face of the base layer, the covering layer on the top face of the base layer being in direct contact with the top face of the base layer and extending to a ridge of the element body where the side surface of the element body meets a top surface of the element body; and
forming a plating layer on the bottom face and the side face of the base layer that is on the side surface of the element body to which said at least one inner electrode is connected so that the covering layer is absent on the plating layer, the plating layer being an outermost layer exposed to an exterior and being absent on and over an entire top surface of the element body, a surface of the covering layer being less wettable than a surface of the plating layer by solder.

17. The method of manufacturing an electronic component according to claim 16, wherein said forming of the covering layer that covers the faces of the base layer includes oxidizing the faces of the base layer to form an oxide film of the metal of the base layer.

18. The method of manufacturing an electronic component according to claim 16,
wherein the electrode material includes a glass component, and
wherein said sintering of the electrode material causes a glass phase composed of the glass component to surface at the faces of the base layer, thereby executing said forming of the covering layer that covers the faces of the base layer during said sintering.

19. The method of manufacturing an electronic component according to claim 16, wherein said removing of the covering layer from the bottom face and the side face of the base layer includes blasting the covering layer on the bottom face and the side face of the base layer.

* * * * *